United States Patent
Pan et al.

(10) Patent No.: US 11,735,591 B2
(45) Date of Patent: Aug. 22, 2023

(54) SEMICONDUCTOR DEVICES WITH DIELECTRIC FINS AND METHOD FOR FORMING THE SAME

(71) Applicant: Taiwan Semiconductor Manufacturing Co., Ltd., Hsinchu (TW)

(72) Inventors: Kuan-Ting Pan, Hsinchu (TW); Chih-Hao Wang, Hsinchu County (TW); Shi Ning Ju, Hsinchu (TW); Jia-Chuan You, Taoyuan County (TW); Kuo-Cheng Chiang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 77 days.

(21) Appl. No.: 17/195,698

(22) Filed: Mar. 9, 2021

(65) Prior Publication Data

US 2021/0366908 A1     Nov. 25, 2021

Related U.S. Application Data

(60) Provisional application No. 63/028,643, filed on May 22, 2020.

(51) Int. Cl.
*H01L 29/161*     (2006.01)
*H01L 27/092*     (2006.01)
(Continued)

(52) U.S. Cl.
CPC .. *H01L 27/0924* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS

| 2019/0035912 A1* | 1/2019 | Ching | H01L 29/66795 |
| 2020/0126869 A1 | 4/2020 | Chu et al. | |
| 2020/0144384 A1 | 5/2020 | Sagong et al. | |

FOREIGN PATENT DOCUMENTS

| TW | 201830692 A | 8/2018 |
| TW | 202006887 A | 2/2020 |

(Continued)

OTHER PUBLICATIONS

Chen, Chun-Yuan et al., "Semiconductor Devices with Backside Air Gap Dielectric", U.S. Appl. No. 16/888,217, filed May 29, 2020, Assignee Taiwan Semiconductor Manufacturing Co., Ltd., 26 pages specification, 16 pages drawings.
(Continued)

*Primary Examiner* — Joseph C. Nicely
*Assistant Examiner* — Lamont B Koo
(74) *Attorney, Agent, or Firm* — Haynes and Boone, LLP

(57) ABSTRACT

A method includes providing a structure having two fins extending from a substrate; an isolation structure isolating bottom portions of the fins; source/drain (S/D) features over each of the fins; a dielectric fin oriented lengthwise parallel to the fins and disposed between the two fins and over the isolation structure; a dummy gate stack over the isolation structure, the fins, and the dielectric fin; and one or more dielectric layers over sidewalls of the dummy gate stack. The method further includes removing the dummy gate stack to result in a gate trench within the one or more dielectric layers, wherein the dielectric fin is exposed in the gate trench; trimming the dielectric fin to reduce a width of the dielectric fin; and after the trimming, forming a high-k metal gate in the gate trench.

20 Claims, 24 Drawing Sheets

(51) Int. Cl.
  *H01L 29/06* (2006.01)
  *H01L 29/66* (2006.01)
  *H01L 21/8234* (2006.01)
  *H01L 29/78* (2006.01)

(52) U.S. Cl.
  CPC .. *H01L 21/823481* (2013.01); *H01L 29/0653* (2013.01); *H01L 29/66795* (2013.01); *H01L 29/7851* (2013.01)

(56) References Cited

FOREIGN PATENT DOCUMENTS

| | | |
|---|---|---|
| TW | 202008436 A | 2/2020 |
| TW | 202015238 A | 4/2020 |

OTHER PUBLICATIONS

Su, Huan-Chieh et al., "Backside Power Rail and Methods of Forming the Same", U.S. Appl. No. 16/901,963 fled Jun. 15, 2020, Assignee Taiwan Semiconductor Manufacturing Co., Ltd., 28 pages specification, 22 pages drawings.

Chen, Chun-Yuan et al., "Anchor-Shaped Backside Via and Method Thereof", U.S. Appl. No. 16/926,447, filed Jul. 10, 2020, Assignee Taiwan Semiconductor Manufacturing Co., Ltd., 32 pages specification, 16 pages drawings.

\* cited by examiner

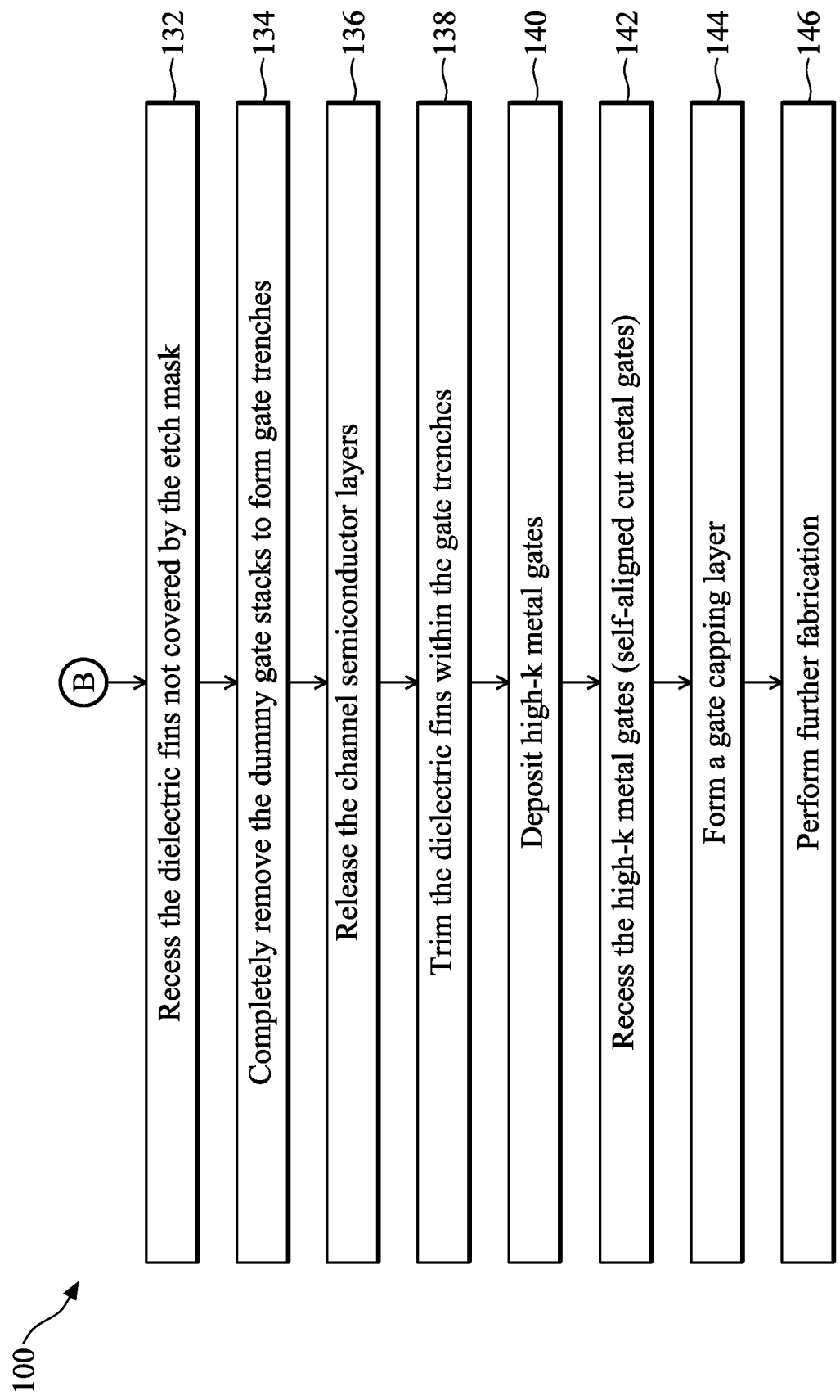

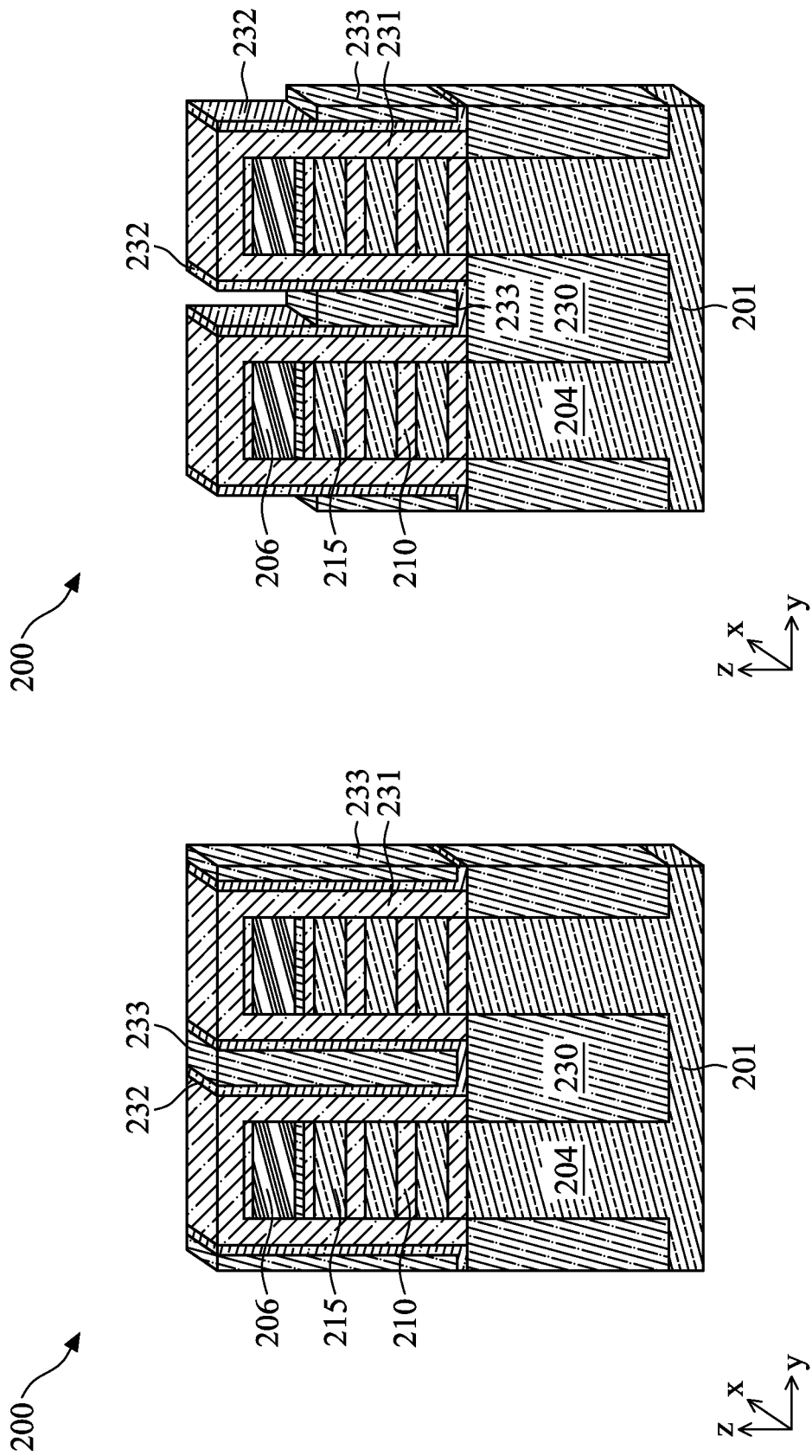

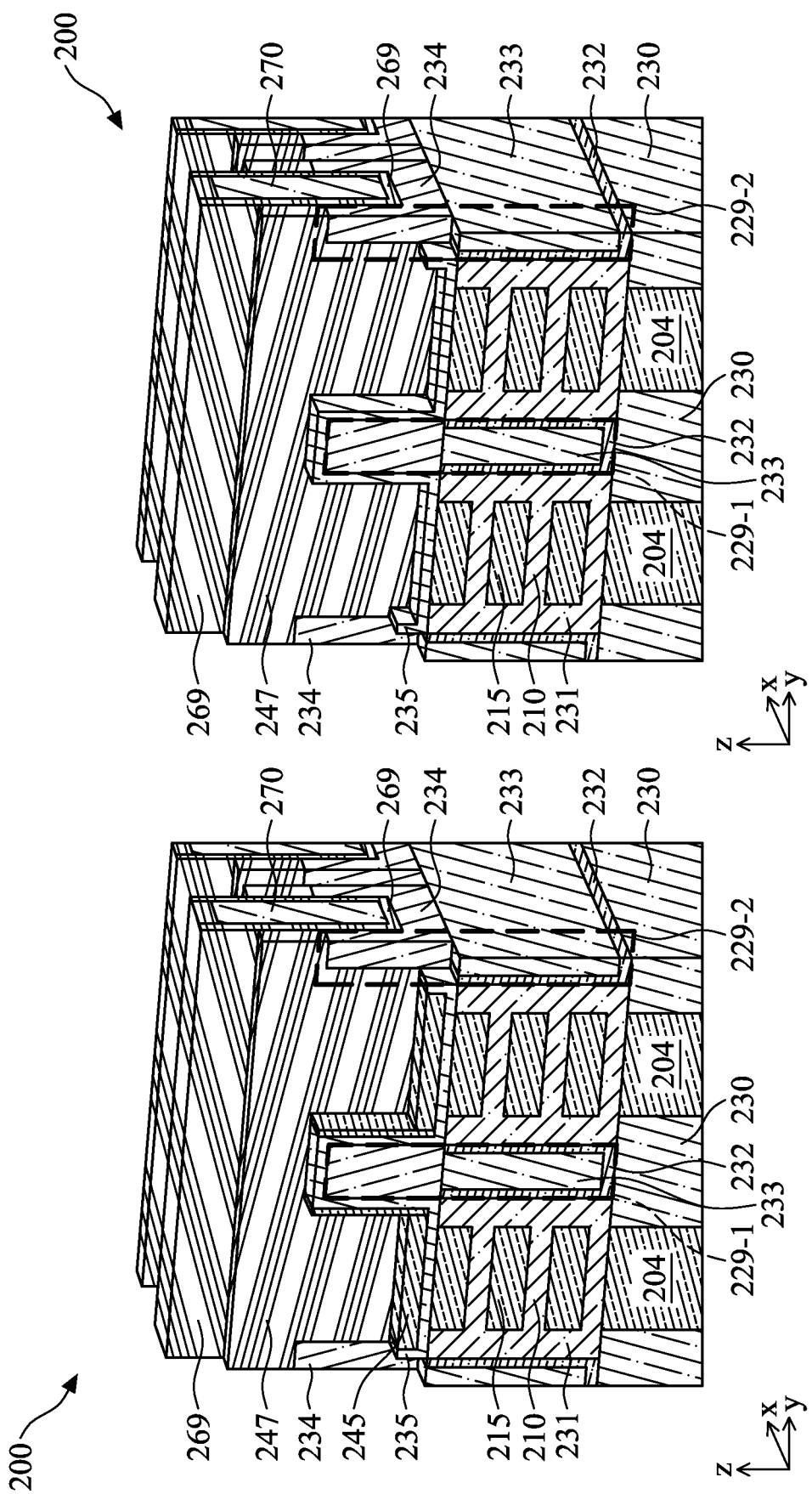

SEMICONDUCTOR DEVICES WITH DIELECTRIC FINS AND METHOD FOR FORMING THE SAME

PRIORITY

The present application claims the benefits of and priority to U.S. Provisional Application Ser. No. 63/028,643 filed May 22, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. One area of interests is how to isolate adjacent metal gate electrodes and how to isolate adjacent source/drain electrodes in highly integrated ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, and 1C show a flow chart of a method of forming a semiconductor device with hybrid dielectric fins, according to various aspects of the present disclosure.

FIGS. 2, 3, 4, 5, 6, 7, 8, 9, 10, 11, 12, 13, 14, 15, 16, 17, 18, 19, 20, 21, 22, 23, 29, and 31 illustrate perspective views of a portion of a semiconductor device, according to some embodiments, in intermediate steps of fabrication according to an embodiment of the method of FIGS. 1A-1C.

FIGS. 24, 25, 26, 27B, 27C, 27D, 28, 30B, 30C, 30D, 32B, and 32C illustrate cross-sectional views of a portion of a semiconductor device, according to some embodiments.

FIGS. 27A, 27E, 30A, 32A, and 32D illustrate top views of a portion of a semiconductor device, according to some embodiments.

DETAILED DESCRIPTION

Figure 1A:
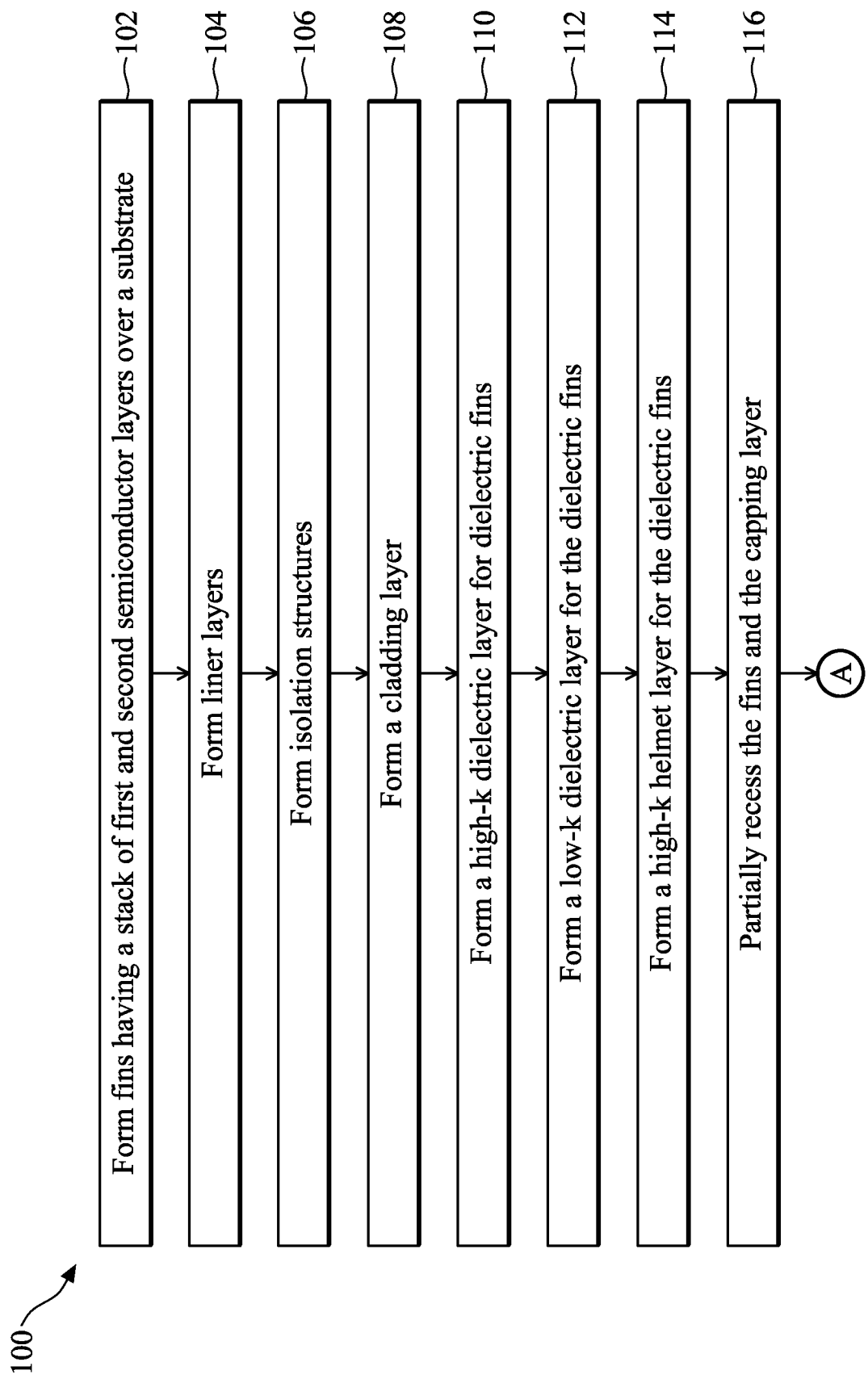

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to using dielectric fins for isolating metal gates and epitaxial source/drain (S/D) features. For example, a dielectric fin is disposed between two metal gates and between S/D features of two transistors. The dielectric fin is trimmed to be narrower between the two metal gates than between the S/D features. Such isolation scheme provides more room for metal gate formation so that the metal gates can be formed more uniformly and with higher quality. This overcomes a common issue with metal gate filling when continuing to scale down the transistors. At the same time, the disclosed isolation scheme provides a greater distance between adjacent S/D features to avoid accidental merging of the S/D features. This overcomes a common issue with S/D engineering when continuing to scale down the transistors. The dielectric fins have a jogged shape from a top view—having two wider sections joined by a narrower section. The corners of the wider sections and the narrower section can be rounded in some embodiments. The dielectric fins may include multiple layers, such as a mix of low-k and high-k layers to achieve etch selectivity during fabrication and to provide low coupling capacitance between the adjacent metal gates and between the adjacent source/drain features. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure can also be utilized to make FinFET devices having the disclosed dielectric fins. For the purposes of simplicity, the present disclosure uses GAA devices as an example, and points out certain differences in the processes between GAA and FinFET embodiments. Those of ordinary skill in the art should appreciate that they may readily use the present disclosure as a basis for designing or modifying other processes and structures for carrying out the same purposes and/or achieving the same advantages of the embodiments introduced herein.

Figure 1B:
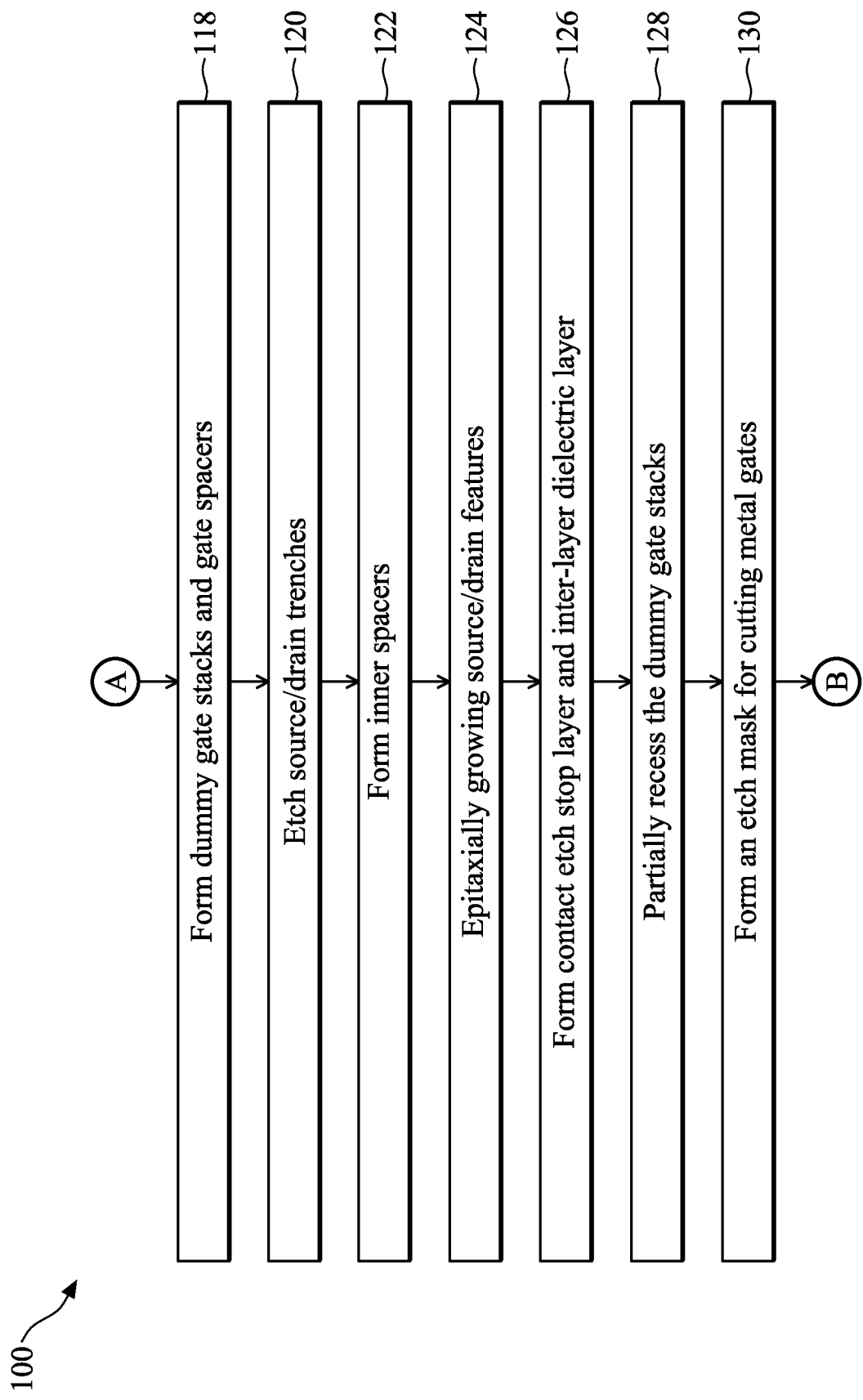

FIGS. 1A, 1B, and 1C are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2 through FIG. 32D that illustrate various perspective, top, and cross-sectional views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 32D have been simplified for the sake of clarity to better understand the inventive concepts of the present disclosure. Additional features can be added in the device 200, and some of the features described below can be replaced, modified, or eliminated in other embodiments of the device 200.

Figure 2:
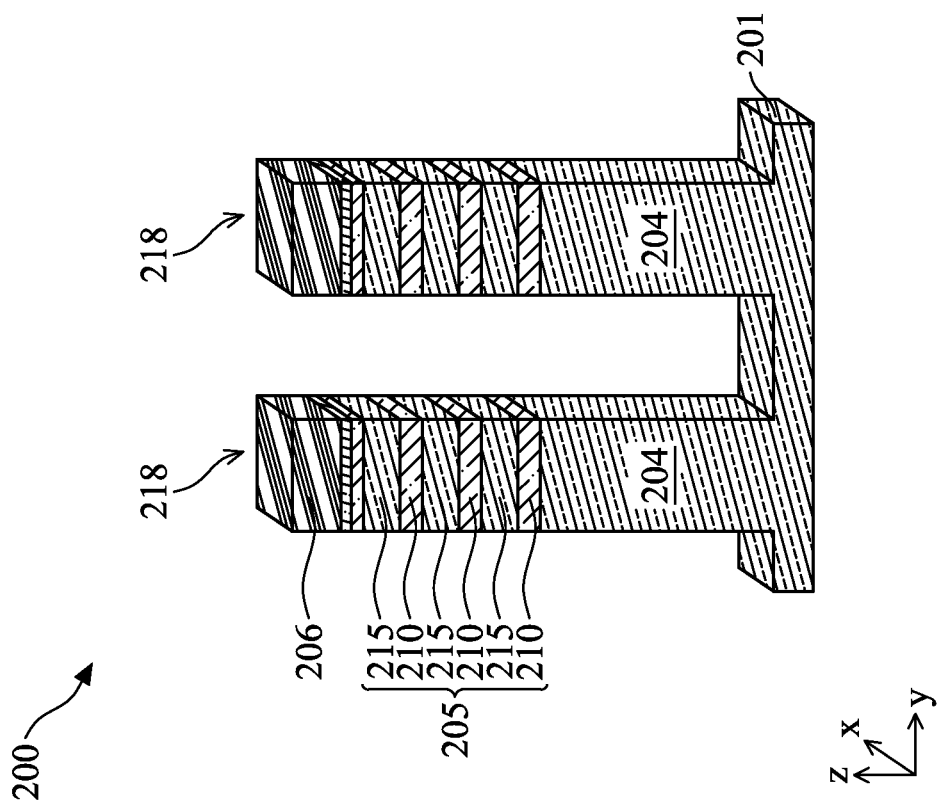

At operation 102, the method 100 (FIG. 1A) forms fins 218 over a substrate 201. The resultant structure is shown in FIG. 2 according to an embodiment. In the depicted embodiment, each fin 218 includes a semiconductor layer 204, a stack 205 of semiconductor layers 210 and 215 over the semiconductor layer 204, and a fin top hard mask 206 over the stack 205. In an embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In an alternative embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

In embodiments, the semiconductor layer 204 can be silicon, silicon germanium, germanium, or other suitable semiconductor, and may be undoped or unintentionally doped with a very low dose of dopants. The semiconductor layer stack 205 is formed over the semiconductor layer 204 and includes semiconductor layers 210 and semiconductor layers 215 stacked vertically (e.g., along the z-direction) in an interleaving or alternating configuration from a surface of the semiconductor layer 204. In some embodiments, semiconductor layers 210 and semiconductor layers 215 are epitaxially grown in the depicted interleaving and alternating configuration. For example, a first one of semiconductor layers 210 is epitaxially grown on the semiconductor layer 204, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of semiconductor layers 210 and semiconductor layers 215. In some embodiments, epitaxial growth of semiconductor layers 210 and semiconductor layers 215 is achieved by a molecular beam epitaxy (MBE) process, a chemical vapor deposition (CVD) process (for example, vapor phase epitaxy (VPE) or ultra-high-vacuum (UHV) CVD), a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200 (e.g., a GAA transistor) and/or design requirements of the device 200. For example, semiconductor layer stack 205 can include two to ten semiconductor layers 210 and two to ten semiconductor layers 215. In an alternative embodiment where the device 200 is a FinFET device, the stack 205 is simply one layer of a semiconductor material, such as one layer of silicon.

The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element (such as the hard mask 206) are used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

Figure 3:
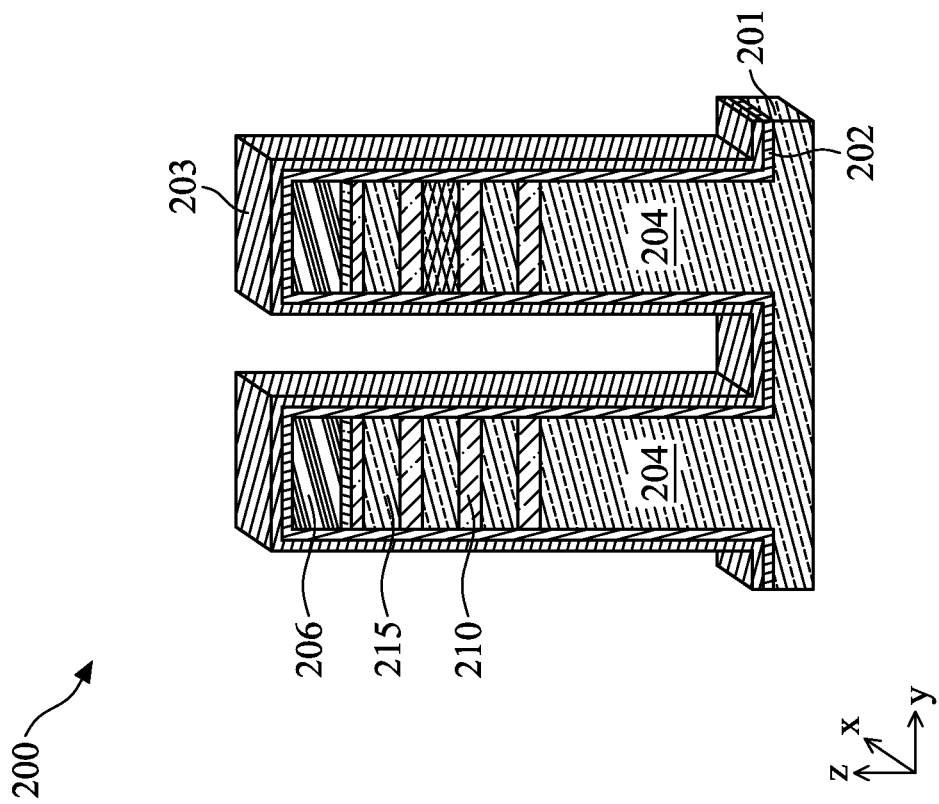

At operation 104, the method 100 (FIG. 1A) forms various liner layers over the substrate 201 and the fins 218, an embodiment of which is illustrated in FIG. 3. In the depicted embodiment, the liner layers include a dielectric liner layer 202 and a semiconductor liner layer 203. The liner layers 202 and 203 are formed along the surfaces of the substrate 201 and the fins 218, and do not completely fill the space between the adjacent fins 218. In an embodiment, each of the liner layers 202 and 203 is formed to have a substantially uniform thickness. In some embodiments, the dielectric liner layer 202 may have a thickness in a range of about 1.5 nm to about 4.5 nm, and the semiconductor liner layer 203 may have a thickness in a range of about 1.5 nm to about 4.5 nm, for example. In the present embodiment, the dielectric liner layer 202 helps to protect the surface of the fins 218 and helps to improve the adhesion between the liner layer 203 and the various surfaces of 201 and 218, and the semiconductor liner layer 203 functions as a seed layer when forming a cladding layer in a subsequent fabrication step. In an embodiment, the dielectric liner layer 202 includes silicon dioxide and the semiconductor liner layer 203 includes silicon, such as crystalline silicon or amorphous silicon. In alternative embodiments, the dielectric liner layer 202 includes other dielectric material(s) such as silicon oxynitride. The dielectric liner layer 202 may be formed by thermal oxidation, chemical oxidation, CVD, atomic layer deposition (ALD), or other methods in various embodiments. The semiconductor liner layer 203 may be formed by CVD, ALD, or other methods in various embodiments.

Figures 4, 5:
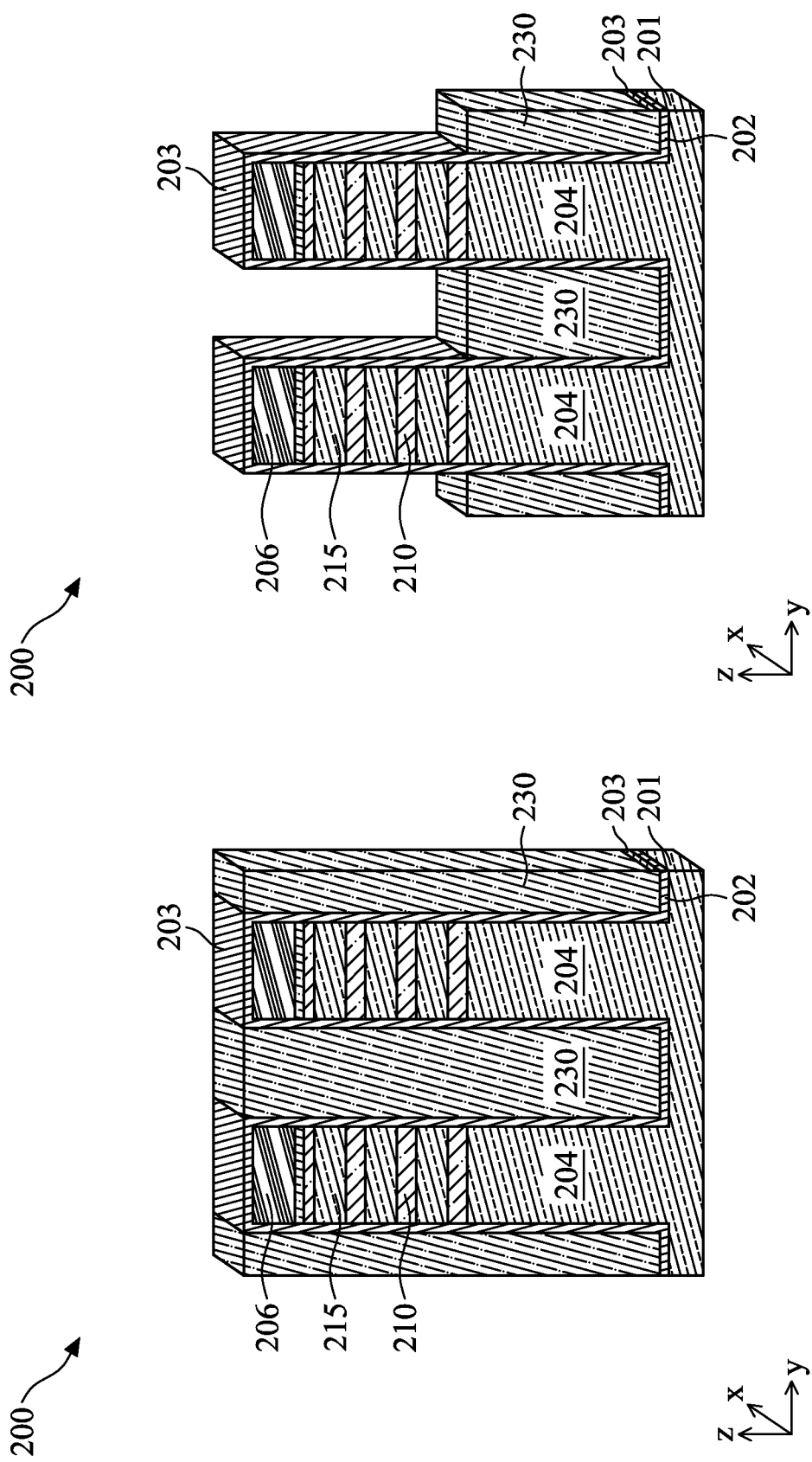

At operation 106, the method 100 (FIG. 1A) forms an isolation structure (or isolation feature(s)) 230 over the substrate 201 to isolate various regions of the device 200, such as shown in FIGS. 4 and 5. For example, isolation features 230 surround a bottom portion of fins 218 to separate and isolate fins 218 from each other. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In some embodiments, isolation features 230 include a multi-layer structure, such as a silicon nitride layer disposed over a thermal oxide liner layer. The isolation features 230 may be formed by multiple steps. For example, insulator material(s) can be deposited to fill the trenches between fins 218, for example, by a CVD process or a spin-on glass process. Then a chemical mechanical polishing (CMP) process is performed to remove excessive insulator material(s) and/or planarize a top surface of the insulator material(s). This is illustrated in FIG. 4. Subsequently, the insulator material(s) are etched back to form isolation features 230, as illustrated in FIG. 5. The etching back of the insulator material(s) use an etching process that is tuned selective to the insulator material(s) and with no (or minimal) etching to the semiconductor liner layer 203. In the depicted embodiment, the insulator material(s) are etched back such that the top surface of the isolation features 230 is below or even with the top surface of the semiconductor layer 204. In alternative embodiments, the insulator material(s) are etched back such that the top surface of the isolation features 230 is below the top surface of the bottommost layer 210 in the stack 205 and above the top surface of the semiconductor layer 204.

Figures 6, 7:
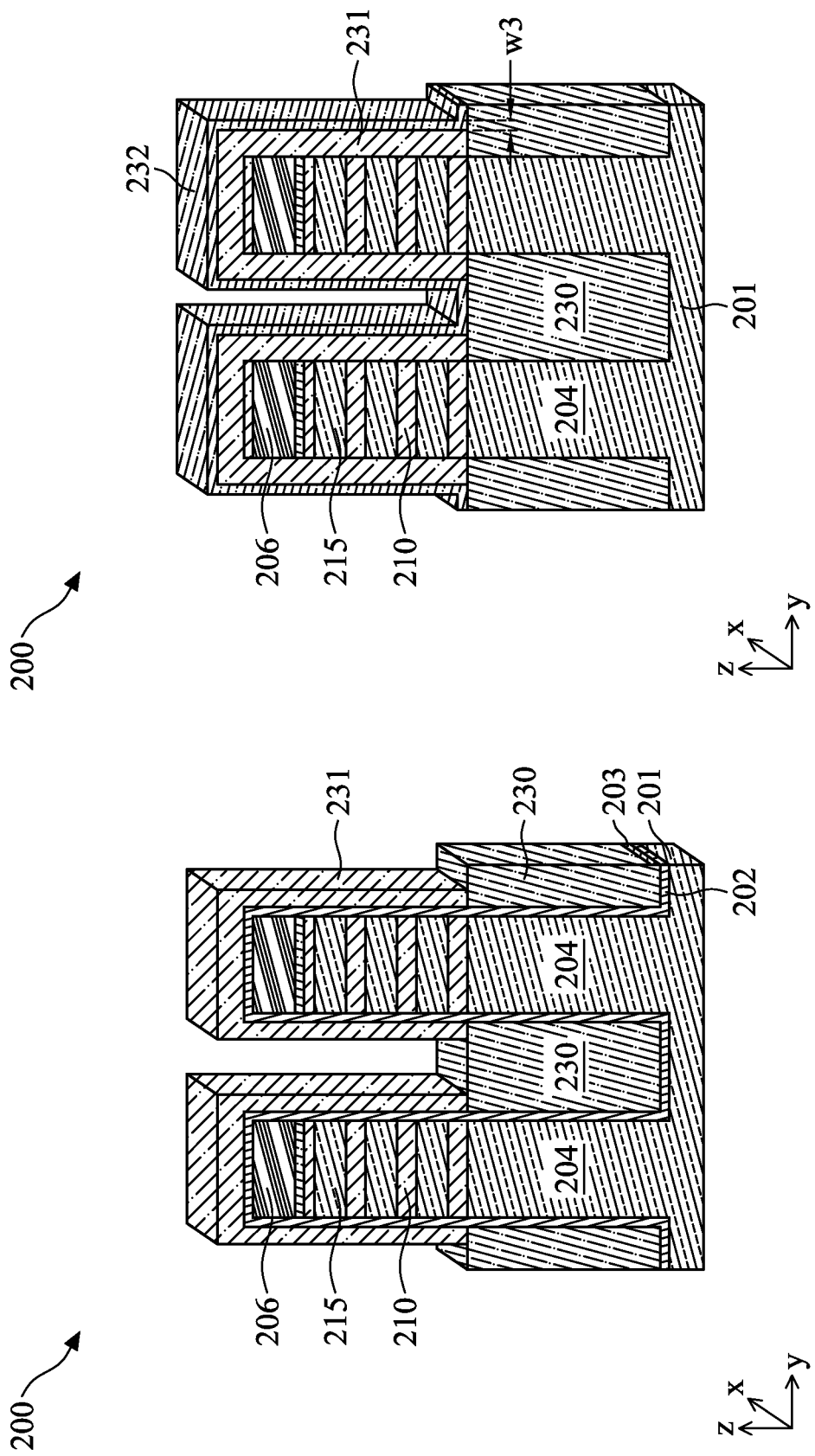

At operation 108, the method 100 (FIG. 1A) forms a cladding layer 231 over the top and sidewall surfaces of the fins 218 and above the isolation features 230. The resultant structure is shown in FIG. 6 according to an embodiment. As depicted in FIG. 6, the cladding layer 231 does not completely fill in the space between the adjacent fins 218. In some embodiments, the cladding layer 231 may be formed to a thickness in a range of about 4 nm to about 12 nm, for example. In an embodiment, the cladding layer 231 includes silicon germanium (SiGe). For example, SiGe can be epitaxially grown from the semiconductor liner layer 203 which includes silicon. The semiconductor liner layer 203 may be incorporated into the cladding layer 231 during the epitaxial growth process. In various embodiments, the cladding layer 231 may be deposited using any suitable epitaxy process, such as VPE and/or UHV CVD, molecular beam epitaxy, other suitable epitaxial growth processes, or combinations thereof. In some embodiments, after the cladding layer 231 is deposited, operation 108 performs an etching process to remove the portion of the cladding layer 231 from above the isolation features 230, for example, using a plasma dry etching process. In such embodiments, the portion of the cladding layer 231 on top of the fins 218 may be partially or completely removed as well.

Figure 29:
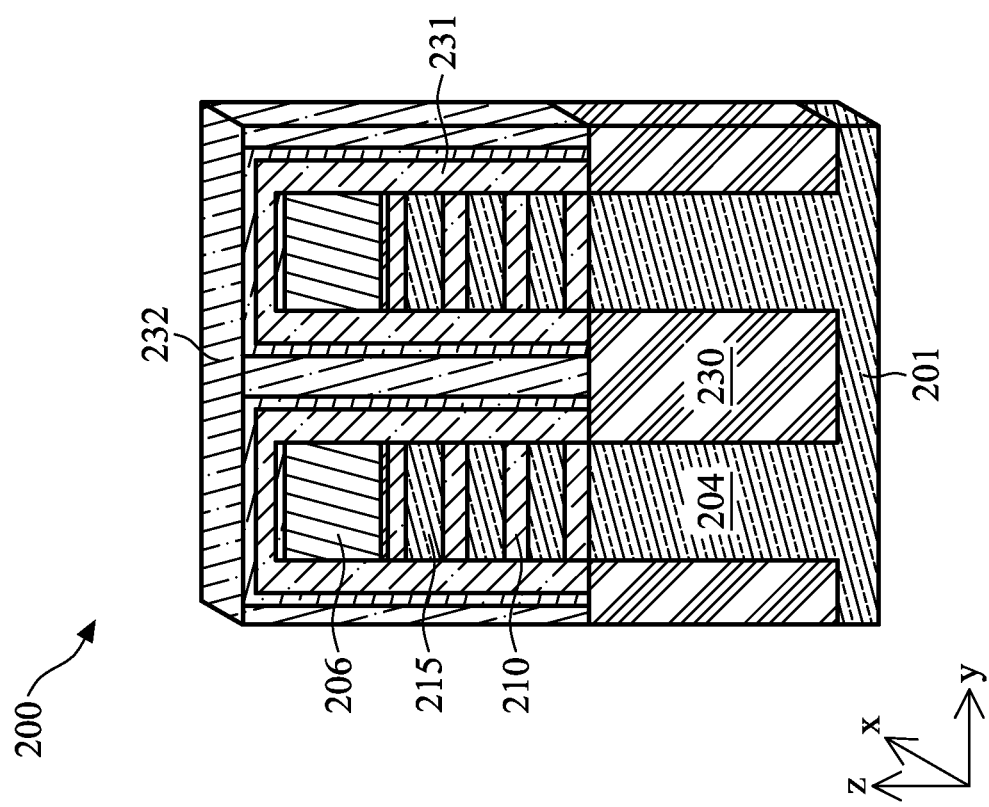

At operation 110, the method 100 (FIG. 1A) forms a dielectric liner 232 over the cladding layer 231 and on top surfaces of the isolation features 230. The resultant structure is shown in FIG. 7 according to an embodiment. As depicted in FIG. 7, the dielectric liner 232 does not completely fill in the space between the adjacent fins 218 in this embodiment. In an alternative embodiment, the dielectric liner 232 completely fills in the space between the adjacent fins 218 such as shown in FIG. 29, which will be discussed later. In the present embodiment, the dielectric liner 232 may be formed to a thickness w3 in a range of about 1 nm to about 6 nm. This thickness is designed to consider the effects upon source/drain features to be formed nearby, which is discussed in more details with reference to FIG. 27B later. In the present embodiment, the dielectric liner 232 includes a high-k dielectric material, such as $HfO_2$, HfSiOx (such as HfSiO$_4$), HfSiON, HfLaO, HfTaO, HfTiO, HfZrO, HfAlO$_x$, ZrO$_2$, ZrSiO$_2$, AlSiO, Al$_2$O$_3$, TiO$_2$, LaO, LaSiO, Ta$_2$O$_3$, Ta$_2$O$_5$, Y$_2$O$_3$, SrTiO$_3$, BaZrO, BaTiO$_3$ (BTO), (Ba,Sr)TiO$_3$ (BST), Si$_3$N$_4$, hafnium dioxide-alumina (HfO$_2$—Al$_2$O$_3$) alloy, other suitable high-k dielectric material, or combinations thereof. In the present disclosure, high-k dielectric material generally refers to dielectric materials having a high dielectric constant, for example, greater than 7. The dielectric liner 232 may be deposited using CVD, PVD, ALD, HDPCVD, MOCVD, RPCVD, PECVD, LPCVD, ALCVD, APCVD, other suitable methods, or combinations thereof. The dielectric liner 232 will be part of dielectric fins in some embodiments, as will be discussed. For simplicity, the liner layers 202 and 203 are not shown in FIG. 7 (but they still exist adjacent the isolation features 230).

At operation 112, the method 100 (FIG. 1A) deposits a dielectric fill layer 233 over the dielectric liner 232 and fills the gaps between the fins 218. Subsequently, the operation 112 may perform a CMP process to planarize the top surface of the device 200 and to expose the cladding layer 231, such as shown in FIG. 8. In the present embodiment, the dielectric fill layer 233 includes a low-k dielectric material such as a dielectric material including Si, O, N, and C (for example, silicon oxide (SiO$_2$), silicon nitride, silicon oxynitride, silicon oxy carbide, silicon oxy carbon nitride). In an embodiment, the dielectric fill layer 233 includes tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), other low-k dielectric materials, or combinations thereof. Some example low-k dielectric materials include Xerogel, Aerogel, amorphous fluorinated carbon, Parylene, BCB, polyimide, or combinations thereof. In the present disclosure, low-k dielectric material generally refers to dielectric materials having a low dielectric constant, for example, lower than 7. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods.

Figures 10, 11:
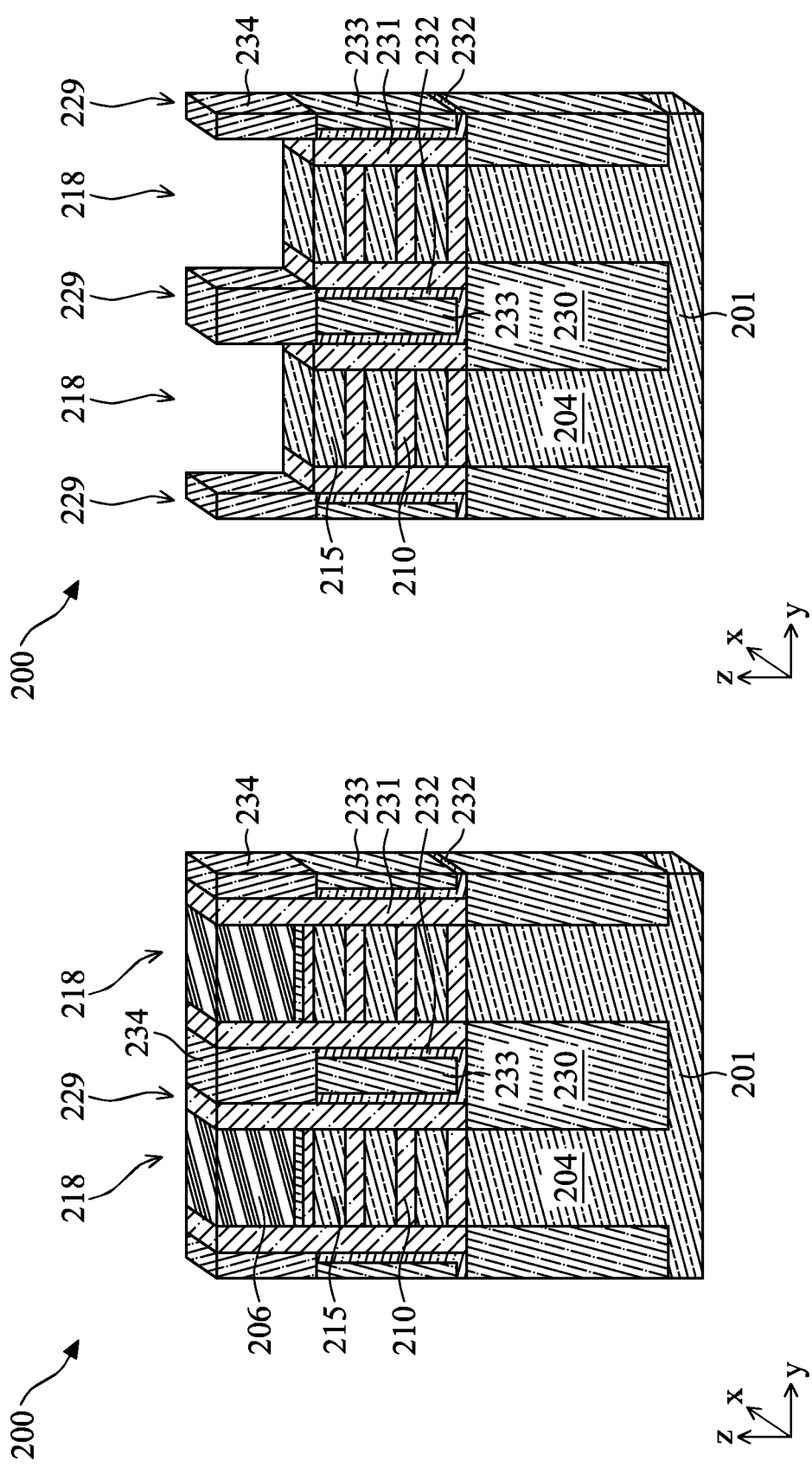

At operation 114, the method 100 (FIG. 1A) forms a dielectric helmet 234 over the dielectric fill layer 233 and between the dielectric liner 232 on opposing sidewalls of the cladding layer 231, such as shown in FIGS. 9 and 10. In an embodiment, the dielectric helmet 234 includes a high-k dielectric material, such as HfO$_2$, HfSiOx (such as HfSiO$_4$), HfSiON, HfLaO, HfTaO, HfTiO, HfZrO, HfAlO$_x$, ZrO$_2$, ZrSiO$_2$, AlSiO, Al$_2$O$_3$, TiO$_2$, LaO, LaSiO, Ta$_2$O$_3$, Ta$_2$O$_5$, Y$_2$O$_3$, SrTiO$_3$, BaZrO, BaTiO$_3$ (BTO), (Ba,Sr)TiO$_3$ (BST), Si$_3$N$_4$, hafnium dioxide-alumina (HfO$_2$—Al$_2$O$_3$) alloy, other suitable high-k dielectric material, or combinations thereof. In an embodiment, the operation 114 includes recessing the dielectric fill layer 233 using a selective etching process that etches the dielectric fill layer 233 with no (or minimal) etching to the dielectric liner 232 and the cladding layer 231. The resultant structure is shown in FIG. 9 according to an embodiment. In various embodiment, the dielectric fill layer 233 is recessed such that the top surface of the dielectric fill layer 233 is about even with the top surface of the topmost layer 215 in the fins 218, for example, the two top surfaces are within +/−5 nm from each other. Keeping the height of the dielectric fill layer 233 at this level helps the etch loading in a subsequent fabrication step (for example, refer to operation 132 where a high-k dielectric layer above the dielectric fill layer 233 is recessed). For example, the top surface of the dielectric fill layer 233 may be higher than the top surface of the topmost layer 215 by up to 5 nm or lower than the top surface of the topmost layer 215 by up to 5 nm. Then, the operation 114 deposits one or more high-k dielectric materials into the recesses using, for example, ALD, CVD, PVD, oxidation-based deposition process, other suitable process, or combinations thereof. Subsequently, the operation 114 performs a CMP process to the one or more high-k dielectric materials and the cladding layer 231 to expose the fin top hard mask 206. The remaining portions of the one or more high-k dielectric materials become the dielectric helmet 234. As illustrated in FIG. 10, the high-k dielectric liner 232, the low-k dielectric fill layer 233, and the high-k dielectric helmet 234 collectively form dielectric fins 229. The low-k dielectric fill layer 233 is surrounded by the high-k dielectric liner 232 and the high-k dielectric helmet 234. The dielectric fins 229 are oriented lengthwise parallel to the fins 218. The dielectric fins 229 and the cladding layer 231 collectively completely fill in the space between adjacent fins 218.

At operation 116, the method 100 (FIG. 1A) partially recesses the fins 218 and the cladding layer 231 that are disposed between the dielectric fins 229. Particularly, the operation 116 removes the hard mask layers 206 and recesses the fins 218 until the topmost semiconductor layer 215 is exposed. The resultant structure is shown in FIG. 11 according to an embodiment. The operation 116 may apply one or more etching processes that are selective to the hard mask layers 206 and the cladding layer 231 and with no (or minimal) etching to the dielectric helmet 234 and the dielectric liner 232. The selective etching processes can be dry etching, wet etching, reactive ion etching, or other suitable etching methods.

Figure 12:
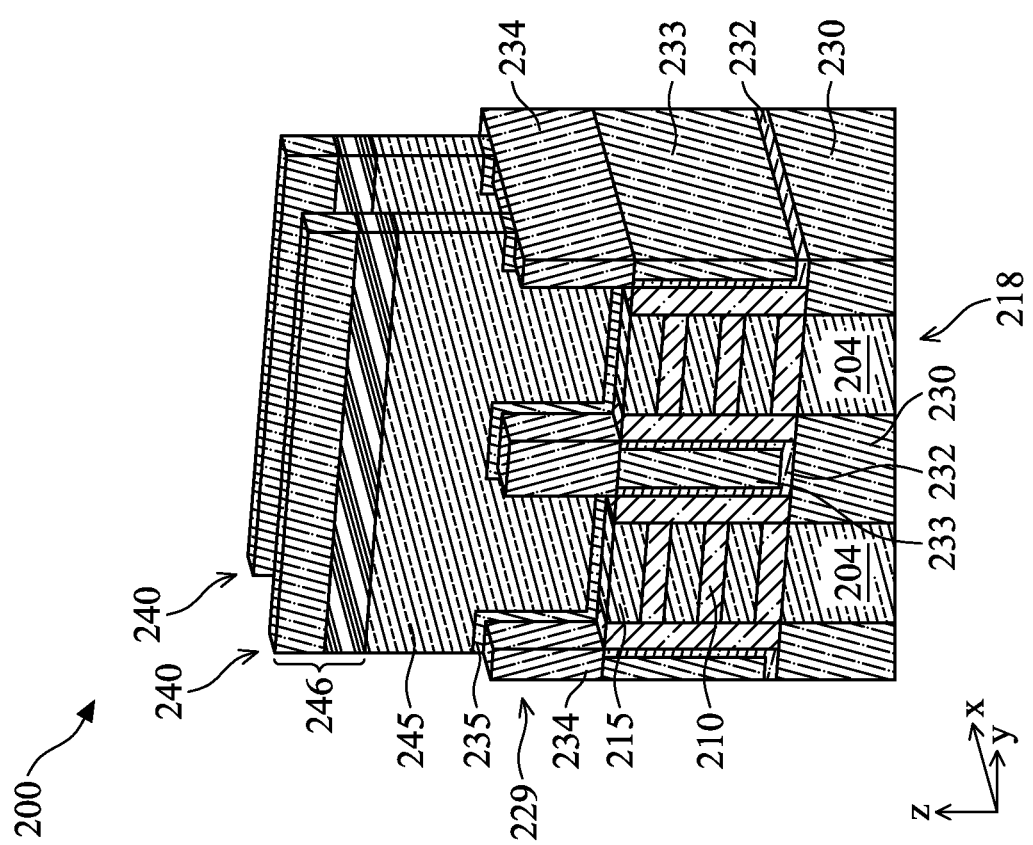

At operation 118, the method 100 (FIG. 1B) forms dummy gate stacks 240 and gate spacers 247. Referring to FIG. 12, each of the dummy gate stacks 240 includes a dummy gate dielectric layer 235 over the surfaces of the fins 218 and the dielectric fins 229, a dummy gate electrode layer 245 over the gate dielectric layer 235, and one or more hard mask layers 246 over the dummy gate electrode layer 245. In an embodiment, the dummy gate dielectric layer 235 includes a dielectric material, such as silicon oxide, a high-k dielectric material, other suitable dielectric material, or combinations thereof. In some embodiments, the dummy gate electrode layer 245 includes polysilicon or other suitable material and the one or more hard mask layers 246 include silicon oxide, silicon nitride, or other suitable materials. The dummy gate dielectric layer 235, the dummy gate electrode layer 245, and the hard mask layers 246 may be deposited using CVD, PVD, ALD, PECVD), LPCVD, ALCVD, APCVD, other suitable methods, or combinations thereof. A lithography patterning and etching process is then performed to pattern the one or more hard mask layers 246, the dummy gate electrode layer 245, and the dummy gate dielectric layer 235 to form dummy gate stacks 240, as depicted in FIG. 12. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Figure 13:
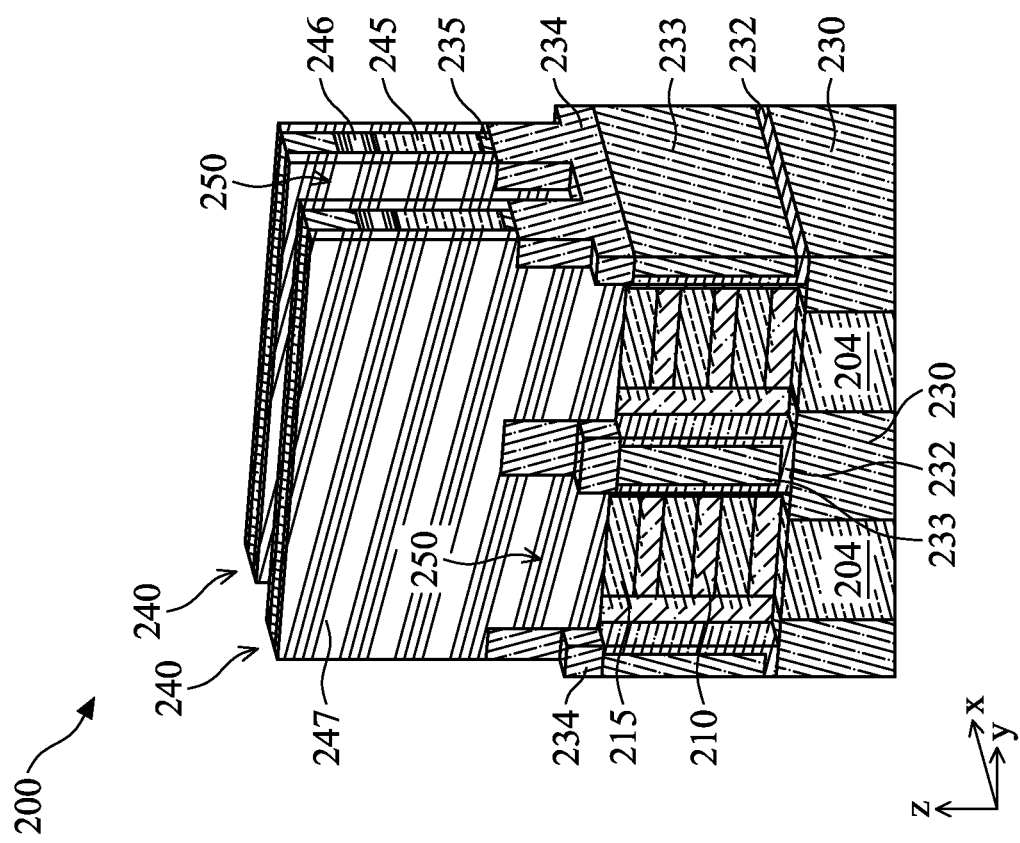

The operation 118 further forms gate spacers 247 on sidewalls of the dummy gate stacks 240 (such as shown in FIG. 13). Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240. In such implementations, the various sets of spacers can include materials having different etch rates. For example, a first dielectric layer including silicon and oxygen (e.g., silicon oxide) can be deposited and etched to form a first spacer set adjacent to dummy gate stacks 240, and a second dielectric layer including silicon and nitrogen (e.g., silicon nitride) can be deposited and etched to form a second spacer set adjacent to the first spacer set.

At operation 120, the method 100 (FIG. 1B) forms source/drain (S/D) trenches 250 by etching the fins 218 adjacent the gate spacers 247. The resultant structure is shown in FIG. 13 according to an embodiment. In the depicted embodiment, an etching process completely removes semiconductor layer stack 205 in source/drain regions of fins 218 thereby exposing the semiconductor layer 204 of fins 218 in the source/drain regions. Source/drain trenches 250 thus have sidewalls defined by remaining portions of semiconductor layer stack 205, which are disposed in channel regions under the gate stacks 240, and bottoms defined by the semiconductor layer 204. In some embodiments, the etching process removes some, but not all, of semiconductor layer stack 205, such that source/drain trenches 250 have bottoms defined by semiconductor layer 210 or semiconductor layer 215 in source/drain regions. In some embodiments, the etching process further removes some, but not all, of the semiconductor layer 204, such that source/drain trenches 250 extend below a topmost surface of the semiconductor layer 204 and below a topmost surface of the isolation features 230. In the depicted embodiment, the dielectric helmet 234 is partially recessed in the source/drain regions. In some alternative embodiment, the dielectric helmet 234 is completely removed in the source/drain regions and the dielectric fill layer 233 is exposed. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of dummy gate stacks 240 and/or isolation features 230. In some embodiments, a lithography process, such as those described herein, is performed to form a patterned mask layer that covers dummy gate stacks 240 and/or isolation features 230, and the etching process uses the patterned mask layer as an etch mask.

Figures 14, 15:
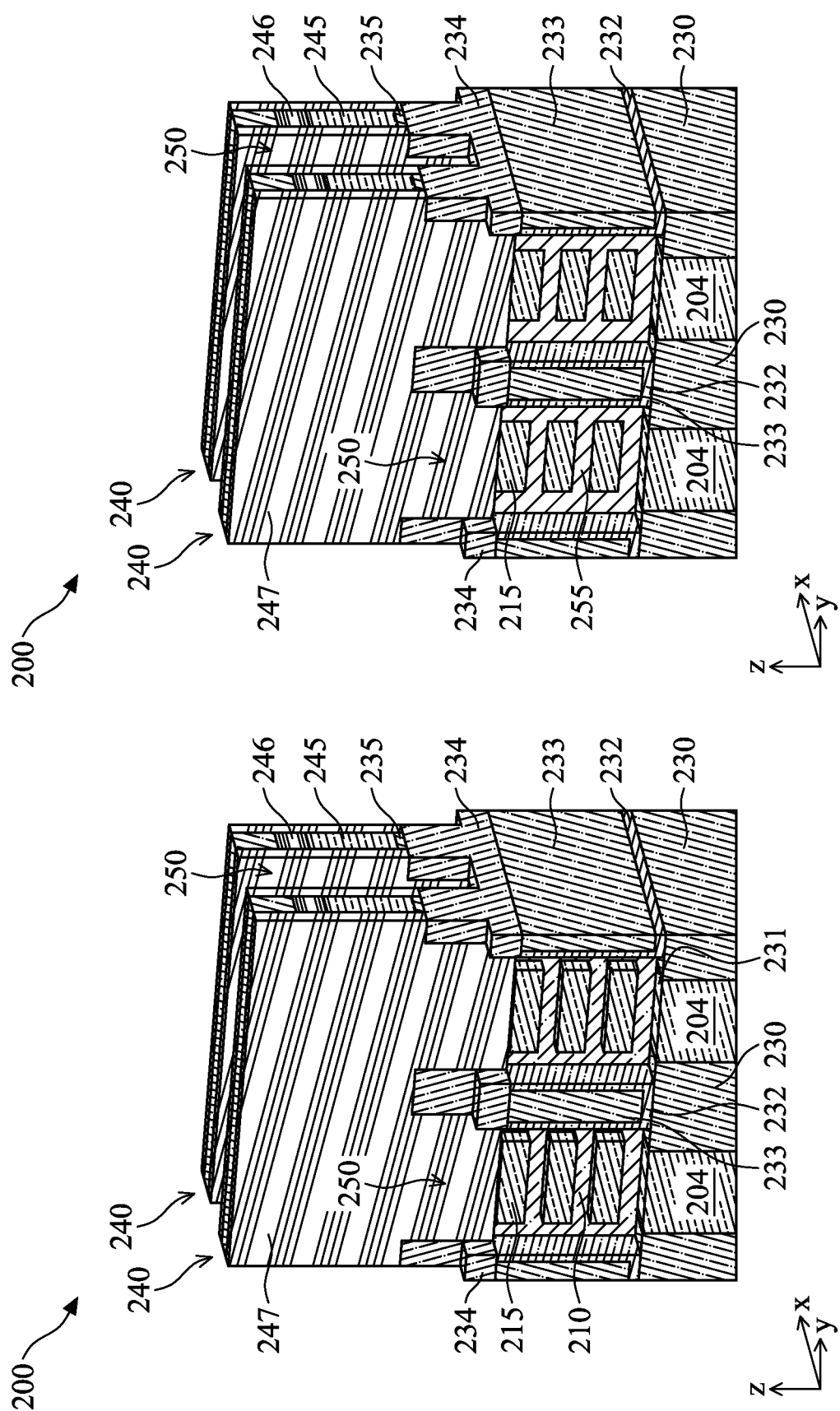

At operation 122, the method 100 (FIG. 1B) forms inner spacers 255 (see FIG. 15) along surfaces of the semiconductor layers 210 inside the S/D trenches 250. This may involve multiple etching and deposition processes. As depicted in FIG. 14, a first etching process is performed that selectively etches semiconductor layers 210 and the cladding layer 231 exposed by source/drain trenches 250 with minimal (to no) etching of semiconductor layers 215, such that gaps are formed between semiconductor layers 215 and between semiconductor layers 215 and 204 under the gate spacers 247. Portions (edges) of semiconductor layers 215 are thus suspended in the channel regions under gate spacers 247. In some embodiments, the gaps extend partially under dummy gate stacks 240. The first etching process is configured to laterally etch (e.g., along the "x" direction) semiconductor layers 210 and cladding layer 231, thereby reducing a length of semiconductor layers 210 and cladding layer 231 along the "x" direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, 204, and 210), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and semiconductor layer 204 under gate spacers 247. A second etching process is then performed that selectively etches the spacer layer to form inner spacers 255 as depicted in FIG. 15 with minimal (to no) etching of semiconductor layers 215 and 204, dummy gate stacks 240, and gate spacers 247. In some embodiments, the spacer layer is removed from sidewalls of gate spacers 247, sidewalls of semiconductor layers 215, dummy gate stacks 240, and semiconductor layer 204. The spacer layer (and thus inner spacers 255) includes a material that is different than a material of semiconductor layers 215 and 204 and a material of gate spacers 247 to achieve desired etching selectivity during the second etching process. In some embodiments, the spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein. In embodiments where the device 200 is a FinFET, the inner spacer 255 is omitted and the operation 122 is skipped.

Figures 16, 17:
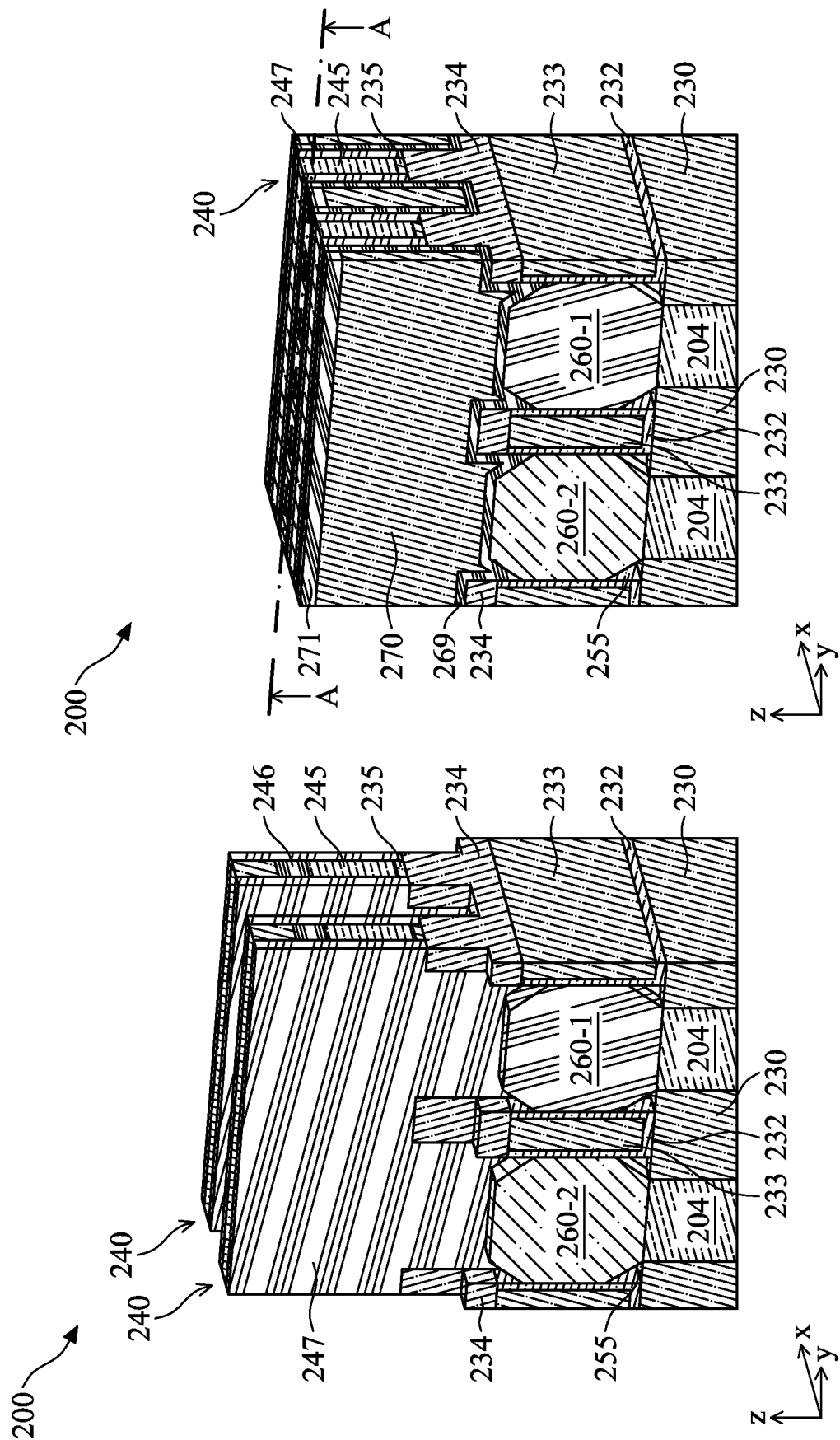

At operation 124, the method 100 (FIG. 1B) epitaxially grows semiconductor S/D features 260 (including S/D features 260-1 and 260-2) in the S/D trenches 250. The resultant structure is shown in FIG. 16 according to an embodiment. In an embodiment, the epitaxial S/D features 260 are grown from the semiconductor layer 204 at the bottom of the S/D trenches 250 and from the semiconductor layers 215 at the sidewalls of the S/D trenches 250. An epitaxy process can use CVD deposition techniques (for example, VPE and/or UHV CVD), molecular beam epitaxy, other suitable epitaxial growth processes, or combinations thereof. The epitaxy process can use gaseous and/or liquid precursors, which interact with the composition of the semiconductor layers 204 and 215 (in particular, semiconductor layers 215). Epitaxial S/D features 260 are doped with n-type dopants or p-type dopants for n-type transistors or p-type transistors respectively. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. In some embodiments, epitaxial S/D features 260 include materials and/or dopants that achieve desired tensile stress and/or compressive stress in respective channel regions. In some embodiments, epitaxial S/D features 260 are doped during deposition by adding impurities to a source material of the epitaxy process (i.e., in-situ). In some embodiments, epitaxial S/D features 260 are doped by an ion implantation process subsequent to a deposition process. In some embodiments, annealing processes (e.g., rapid thermal annealing (RTA) and/or laser annealing) are performed to activate dopants in epitaxial S/D features 260. In some embodiments, some epitaxial S/D features 260 are of p-type and others are of n-type. For example, the S/D feature 260-1 is of p-type and S/D feature 260-2 is of n-type. In such embodiments, the p-type and the n-type S/D features 260 are formed in separate processing sequences that include, for example, masking p-type GAA transistor regions when forming epitaxial S/D features 260 in n-type GAA transistor regions and masking n-type GAA transistor regions when forming epitaxial S/D features 260 in p-type GAA transistor regions. In various embodiments, the S/D features 260-1 and 260-2 may both be p-type, both be n-type, or one is p-type and the other is n-type. Further, as shown in FIG. 16, the size of the S/D features 260 are confined by the dielectric fins 229. Particularly, the dielectric fins 229 are taller than the S/D features 260 to ensure that adjacent S/D features 260 do not merge with each by accident. This improves the yield of the device 200. In some embodiments, air gaps (or voids) are formed and surrounded by the S/D features 260, the isolation features 230, and the dielectric fins 229.

At operation 126, the method 100 (FIG. 1B) forms a contact etch stop layer (CESL) 269 over the S/D features 260 and an inter-layer dielectric (ILD) layer 270 over the CESL 269 and fills the space between opposing gate spacers 247. The resultant structure is shown in FIG. 17 according to an embodiment. The CESL 269 includes a material that is different than ILD layer 270. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, the operation 126 performs a CMP process and/or other planarization process to the CESL 269, the ILD layer 270, and the hard mask layer 246 until a top portion (or top surface) of dummy gate electrode layer 245 is exposed. In the present embodiment, the ILD layer 270 is recessed to a level below the top surface of the dummy gate electrode layer 245 and an ILD protection layer 271 is deposited over the ILD layer 270 to protect the ILD layer 270 from subsequent etching processes that are performed to the dummy gate stacks 240 and the dielectric fins 229, as will be discussed later. As shown in FIG. 17, the ILD layer 270 is surrounded by the CESL 269 and the ILD protection layer 271. In an embodiment, the ILD protection layer 271 includes a material that is the same as or similar to that in the CESL 269. In embodiments, the ILD protection layer 271 includes a dielectric material such as $Si_3N_4$, SiCN, SiOCN, SiOC, a metal oxide such as $HrO_2$, $ZrO_2$, hafnium aluminum oxide, and hafnium silicate, or other suitable material, and may be formed by CVD, PVD, ALD, or other suitable methods.

Figures 18, 19:
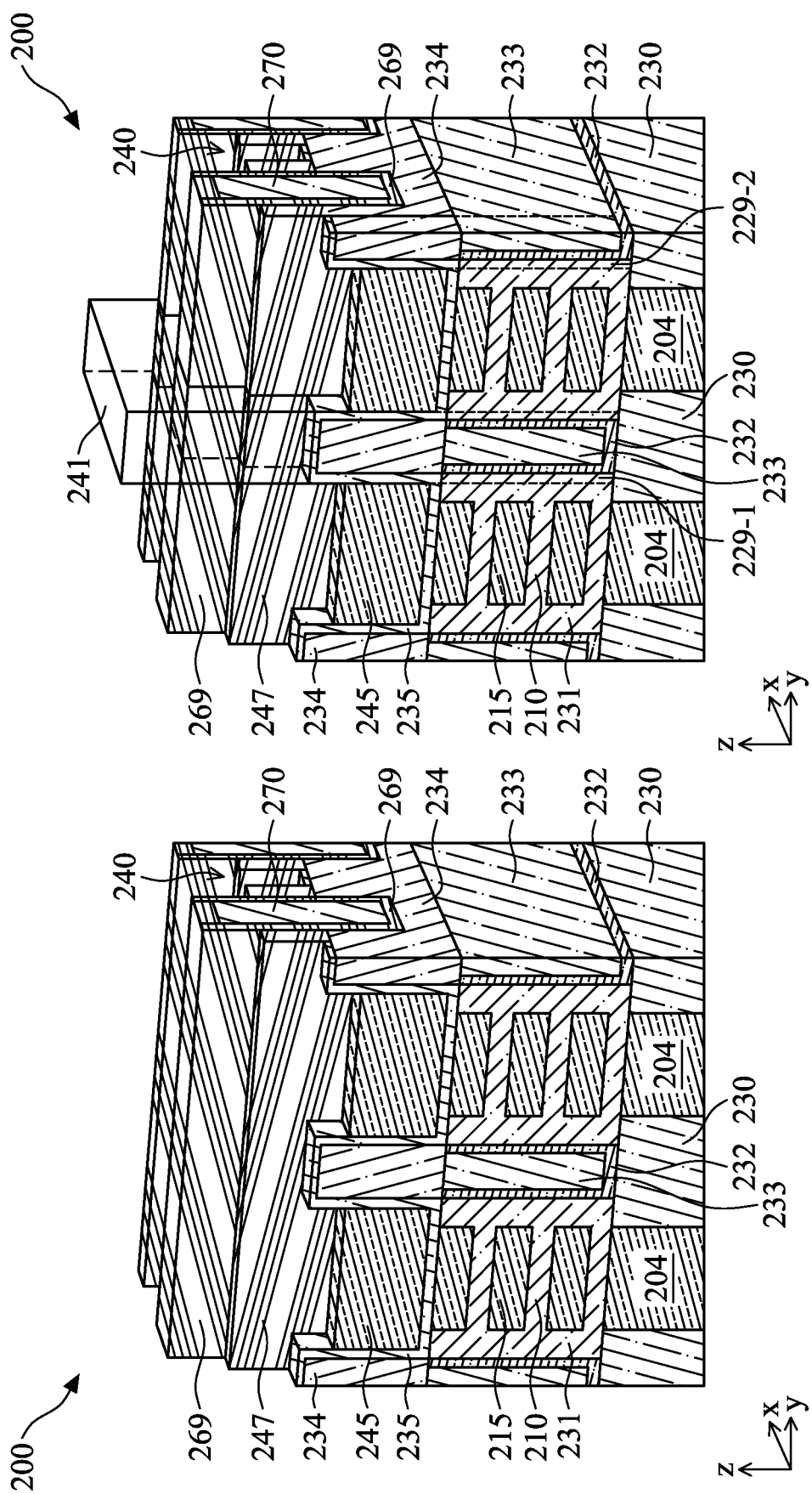

At operation 128, the method 100 (FIG. 1B) partially recesses the dummy gate electrode 245 such that the top surface of the dummy gate electrode 245 is below the top surface of the dielectric fins 229. The resultant structure is shown in FIG. 18 according to an embodiment. The front of the FIG. 18 is viewed across the line A-A in FIG. 17. The operation 128 may use a dry etching process, a wet etching process, other suitable etching process, or combinations thereof. Further, the etching process is configured to selectively etch dummy gate electrode 245 with minimal (to no) etching of other features of the device 200, such as the CESL 269, the ILD protection layer 271, and the dummy gate dielectric layer 235. In the embodiment depicted in FIG. 18, the gate spacers 247 are also partially recessed. In an alternative embodiment, the gate spacers 247 are not recessed or are only minimally recessed.

At operation 130, the method 100 (FIG. 1B) forms an etch mask 241 covering dielectric fins 229 that will separate (or cut) metal gates in a subsequent fabrication step. These dielectric fins 229 are labeled as 229-1. Other dielectric fins 229 are labeled as 229-2, which are not covered by the etch mask 241. The resultant structure is shown in FIG. 19 according to an embodiment. The etch mask 241 includes a material that is different than a material of the dummy gate dielectric layer 235 and the dielectric fins 229 (including the layers 234, 233, and 232) to achieve etching selectivity. In an embodiment, the etch mask 241 includes a patterned resist over a patterned hard mask (such as a patterned mask having silicon nitride). In some embodiments, the etch mask 241 further includes an anti-reflective coating (ARC) layer or other layer(s) between the patterned resist and the patterned hard mask. The present disclosure contemplates other materials for the etch mask 241, so long as etching selectivity is achieved during the etching of the dielectric fins 229-2 and the dummy gate dielectric layer 235. In some embodiments, after depositing a hard mask layer (e.g., a silicon nitride layer), operation 130 performs a lithography process that includes forming a resist layer over the hard mask layer (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the resist layer is patterned into a resist pattern that corresponds with the mask. Alternatively, the exposure process can be implemented or replaced by other methods, such as maskless lithography, e-beam writing, ion-beam writing, or combinations thereof. The hard mask layer is then etched through the patterned resist to result in a patterned hard mask.

At operation 132, the method 100 (FIG. 1C) etches the dummy gate dielectric layer 235 and the dielectric fins 229-2 through the etch mask 241. The resultant structure is shown in FIG. 20 according to an embodiment. Particularly, the dielectric fins 229-2 are etched until the top surface of the low-k dielectric fill layer 233 thereof is exposed. The dummy gate electrode 245 is partially removed by the operation 132 in the depicted embodiment. In an alternative embodiment, the dummy gate electrode 245 is completely removed by the operation 132 in areas that are not covered by the etch mask 241. Subsequently, the etch mask 241 is removed, for example, by stripping, ashing, and/or other methods.

Figures 22, 23:
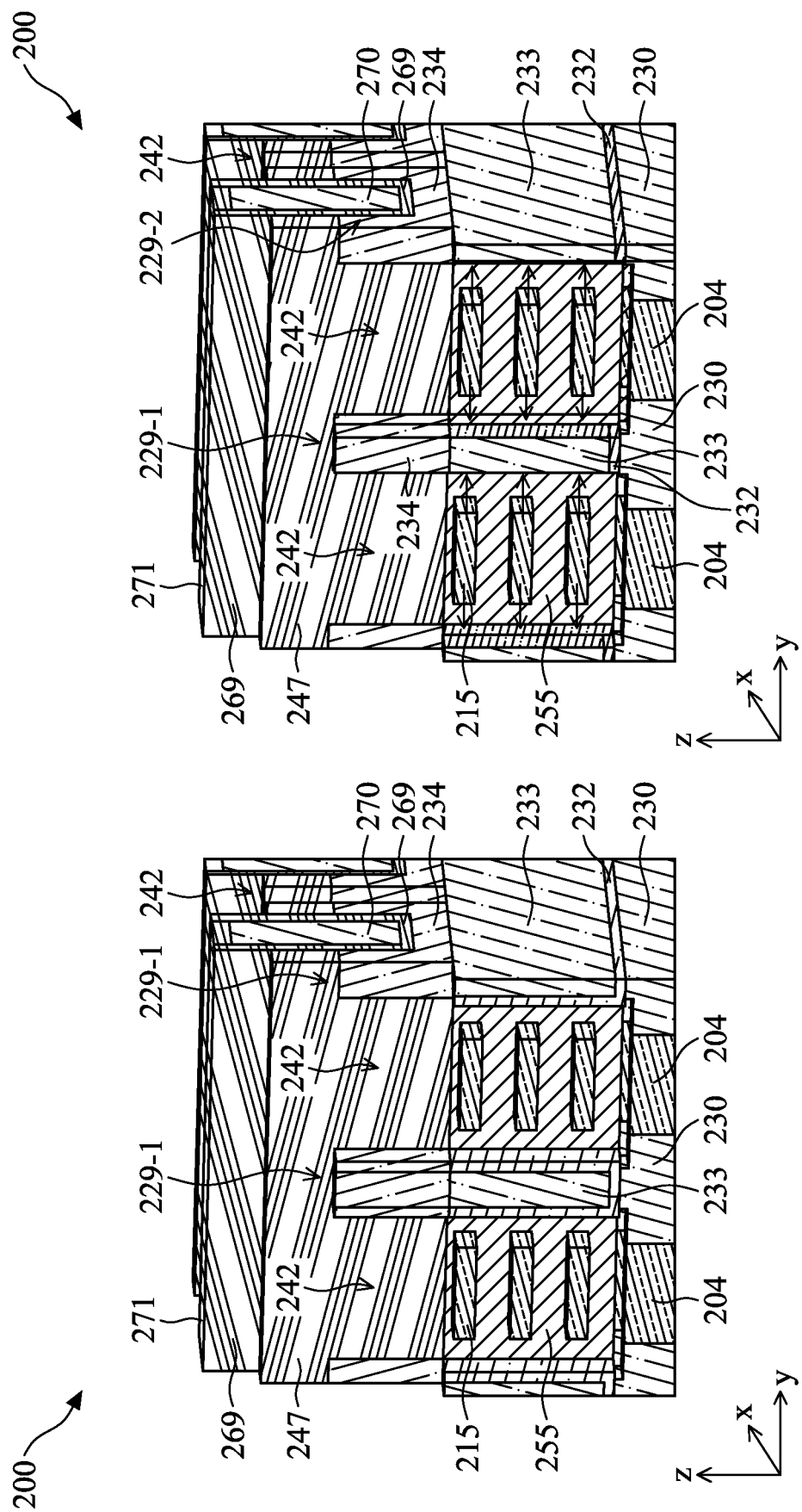

At operation 134, the method 100 (FIG. 1C) completely removes the dummy gate stacks 240 (i.e., any remaining portions of the dummy gate electrode 245 and the dummy gate dielectric layer 235) to form gate trenches 242 (FIGS. 21 and 22). In an embodiment, the operation 134 applies a first etching process (such as a wet etching) to remove any remaining portions of the dummy gate electrode 245. The resultant structure is shown in FIG. 21 according to an embodiment. Then, the operation 134 applies a second etching process (such as a wet etching or a dry etching) to remove any remaining portions of the dummy gate dielectric layer 235, resulting in gate trenches 242, such as shown in FIG. 22. In some embodiments, the etching processes in the operation 134 are configured to selectively etch dummy gate stacks 240 with minimal (to no) etching of other features of the device 200, such as the CESL 269, the ILD protection layer 271, the gate spacers 247, the isolation features 230, and the dielectric fins 229-1 and 229-2.

At operation 136, the method 100 (FIG. 1C) removes the cladding layer 231 and the semiconductor layers 210 exposed in the gate trench 242, leaving the semiconductor layers 215 suspended over the semiconductor layer 204 and connected with the S/D features 260, such as shown in FIG. 22. This process is also referred to as a channel release process and the semiconductor layers 215 are also referred to as channel layers. The etching process selectively etches the cladding layer 231 and the semiconductor layers 210 with minimal (to no) etching of semiconductor layers 215 and, in some embodiments, minimal (to no) etching of gate spacers 247 and/or inner spacers 255. In embodiments where the device 200 is a FinFET, the channel release process is omitted because there is only one channel layer 215 and there are no semiconductor layers 210 in the channel region.

At operation 138, the method 100 (FIG. 1C) trims the portion of the dielectric fins 229-1 and 229-2 that are exposed in the gate trenches 242, such as illustrated in FIG. 23. In an embodiment, the operation 138 includes two etching processes that are designed to target the materials of the high-k dielectric liner 232 and the low-k dielectric fill layer 233 respectively. For example, the operation 138 applies a first etching process (such as a wet etching or a plasma etching) to remove the high-k dielectric liner 232 from the sidewalls of the low-k dielectric fill layer 233 as well as from the sidewalls of the high-k dielectric helmet 234. Then, the operation 138 applies a second etching process (such as another wet etching or another plasma etching) to laterally etch the low-k dielectric fill layer 233 along the "y" direction. In some embodiments, the low-k dielectric fill layer 233 becomes narrower than the high-k dielectric helmet 234 due to the second etching process. The first and the second etching processes are designed to laterally etch the layers 232 and 233 along the "y" direction, for example, by isotropic plasma etching or chemical etching. The etching processes may also reduce the width (along the "y" direction) and the height (along the "z" direction) of the high-k dielectric helmet 234. Notably, a portion of the high-k dielectric liner 232 remains below the low-k dielectric fill layer 233. In various embodiments, the operation 138 may use one etching process to etch both the high-k dielectric liner 232 and the low-k dielectric fill layer 233 or use more than two etching processes to achieve the same or similar results as discussed above. Further, in various embodiments, the etching processes in the operation 138 are configured to selectively etch the dielectric fins 229 with minimal (to no) etching of other features of the device 200, such as the CESL 269, the ILD protection layer 271, the gate spacers 247, the isolation features 230, the inner spacers 255, and the semiconductor layers 215 and 204.

Due to the operation 138, the portions of the dielectric fins 229-1 and 229-2 exposed in the gate trenches 242 become narrower than their original width (along the "y" direction). The other portions of the dielectric fins 229-1 and 229-2 (that are covered by the ILD layer 270 and the gate spacers 247) are not trimmed and maintain their widths the same as their original widths. The gate trenches 242 are laterally expanded (i.e., along the "y" direction) and the space between the semiconductor layers 215 and the dielectric fins 229 are also laterally expanded. Having expanded gate trenches 242 eases the deposition of high-k metal gates therein as devices continue to scale down. In some approaches without the trimming of the dielectric fins 229, the gate trenches are narrow, and deposition of high-k metal gates may be difficult. In some instances, voids might remain in the gate trenches after high-k metal gate deposition, which would lead to long-term reliability issues and non-uniform transistor performance. In the present embodiment, trimming of the dielectric fins 229 inside the gate trenches 242 eliminates or alleviates those issues.

In some embodiments, the operation 138 may use a timer or other means to control the amount of trimming of the dielectric fins 229. In various embodiments, the portions of the dielectric fins 229-1 and 229-2 exposed in the gate trenches 242 are trimmed such that their widths are reduced to about 0.35 to about 0.8 of their original width. In some embodiments, the portions of the dielectric fins 229-1 and 229-2 exposed in the gate trenches 242 are trimmed such that their widths are reduced by about 2 nm to about 12 nm from their original width. If the reduction in their widths is too small (for example, the reduction is less than 2 nm or their widths are still more than 80% of their original width), then the gate trenches 242 may not be expanded large enough to have meaningful improvements and metal gates therein might still have voids. If the reduction in their widths is too large (for example, the reduction is more than 12 nm or their widths are less than 35% of their original width), then the dielectric fins 229 might not be thick enough to isolate adjacent metal gates, degrading long-term reliability.

Figure 24:
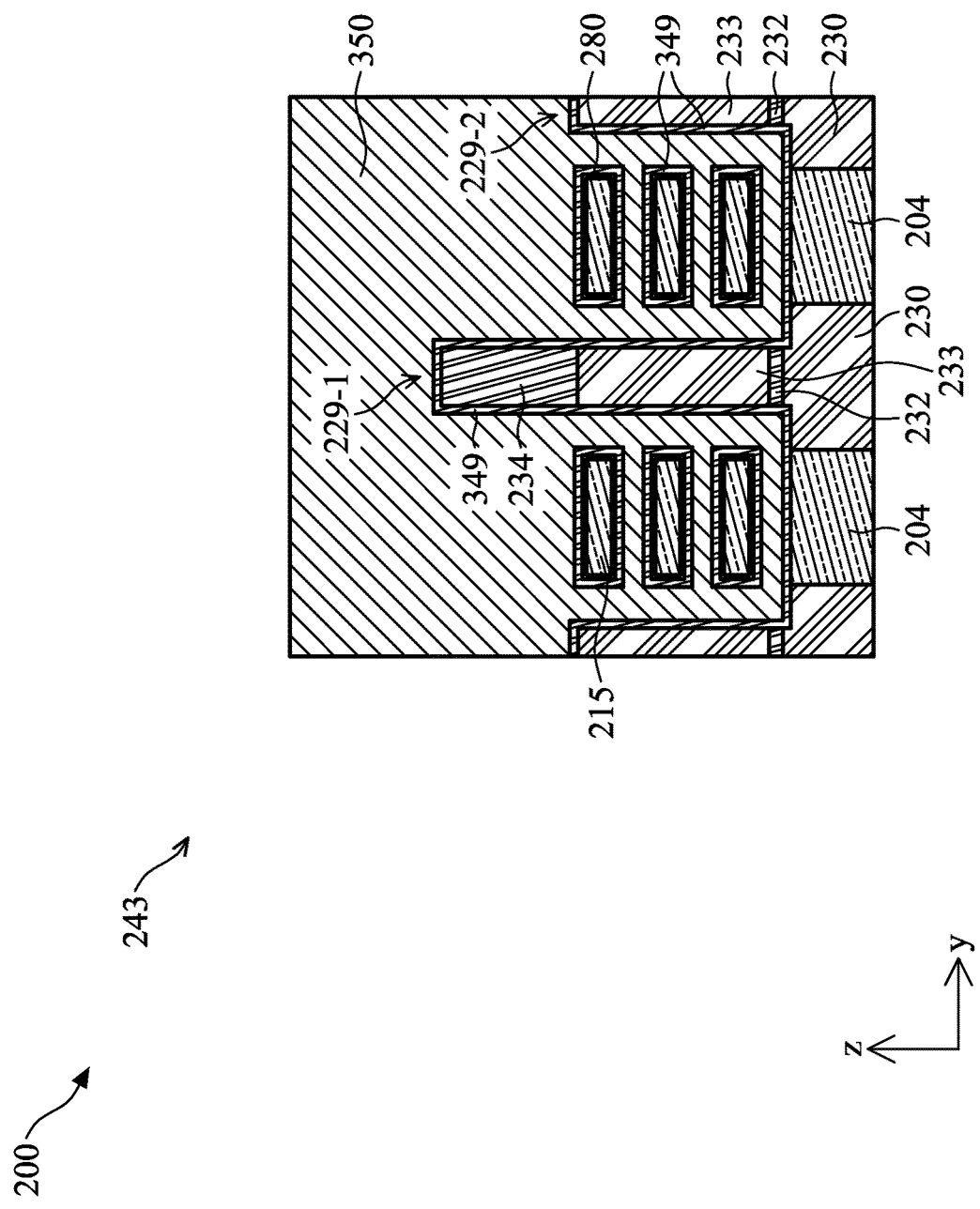

At operation 140, the method 100 (FIG. 1C) forms a high-k metal gate 243 in the gate trench 242. The resultant structure is shown in FIG. 24 according to an embodiment. The high-k metal gate 243 includes a gate dielectric layer 349 that wraps around each of the semiconductor layers 215 and a gate electrode 350 over the gate dielectric layer 349.

The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, $Al_0$, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The gate dielectric layer 349 may be formed by chemical oxidation, thermal oxidation, atomic layer deposition (ALD), chemical vapor deposition (CVD), and/or other suitable methods. Particularly, the gate dielectric layer 349 is also deposited over the top surface and the sidewalls of the dielectric fins 229 (including the dielectric fins 229-1 and 229-2). As illustrated in FIG. 24, the low-k dielectric fill layer 233 is once again surrounded by high-k dielectric layers. At this fabrication stage, the low-k dielectric fill layer 233 in the portion of the dielectric fin 229-1 under the gate electrode 350 is surrounded by the high-k dielectric layer 232 at its bottom, the high-k gate dielectric layer 349 at its sidewalls, and the high-k dielectric helmet 234 at its top surface; and the low-k dielectric fill layer 233 in the portion of the dielectric fin 229-2 under the gate electrode 350 is surrounded by the high-k dielectric layer 232 at its bottom and the high-k gate dielectric layer 349 at its sidewalls and top surface. In some embodiments, the high-k metal gate 243 further includes an interfacial layer 280 between the gate dielectric layer 349 and the channel layers 215. The interfacial layer 280 may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, or other suitable processes. As discussed earlier, because of the expanded space in the gate trenches 242, the deposition of the interfacial layer 280, the high-k gate dielectric layer 349, and the gate electrode layer 350 becomes easier and the gate trenches 242 can be fully filled with these layers, leaving no voids. This improves the transistors' uniformity and long-term reliability.

Figures 25, 26:
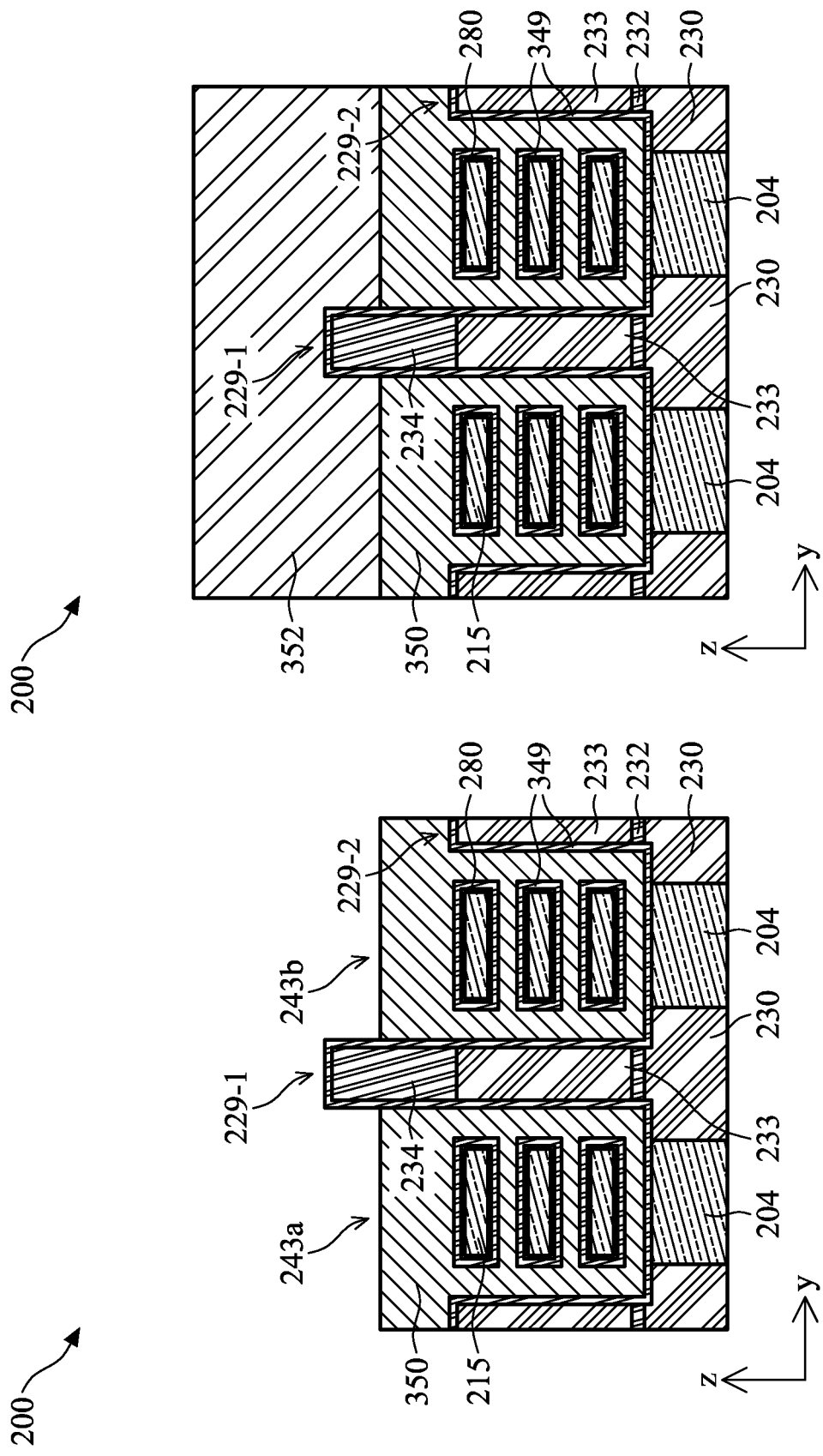

At operation 142, the method 100 (FIG. 1C) recesses the gate electrode layer 350 such that its top surface is below the top surface of the dielectric fin 229-1 but above the top surface of the dielectric fins 229-2. The resultant structure is shown in FIG. 25 according to an embodiment. As illustrated in FIG. 25, operation 142 effectively cuts or separates the gate electrode layer 350 into two segments, resulting in two separate high-k metal gates (or two high-k metal gate segments) 243a and 243b. The dielectric fin 229-1 isolates the two gates 243a and 243b. This process is sometimes referred to as self-aligned cut metal gate process (or self-aligned metal gate cut process) because it cuts metal gates without using a photolithography process in this step and the location of the cuts is predetermined by the location of the dielectric fins 229-1. Self-aligned cut metal gate process is more advantageous than photolithographic cut metal gate process in that the former is less impacted by photolithography overlay window or shift. This further enhances device down-scaling. Notably, the gate electrode layer 350 is not cut at the locations of the dielectric fins 229-2. In other words, the gate electrode layer 350 to the left and to the right of the dielectric fin 229-2 remains connected as one continuous gate electrode layer and functions as one gate. The operation 142 may implement a wet etching or a dry etching process that selectively etches the gate electrode layer 350 with minimal (to no) etching of the high-k dielectric helmet 234. In some embodiments, the etching process also has minimal (to no) etching of the high-k gate dielectric layer 349 such that the high-k gate dielectric layer 349 substantially remains over the top surface and the sidewalls of the high-k dielectric helmet 234. In some embodiments, the high-k gate dielectric layer 349 may also be etched by the operation 142. In some embodiments, the gate spacers 247 may also be partially recessed by the operation 142.

At operation 144, the method 100 (FIG. 1C) forms a dielectric capping layer 352 over the gate electrode layer 350 and over the dielectric fin 229-1. The resultant structure is shown in FIG. 26 according to an embodiment. In some embodiments, the dielectric capping layer 352 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric capping layer 352 protects the metal gates 243 (including metal gates 243a and 243b) from etching and CMP processes that are used for etching S/D contact holes. The dielectric capping layer 352 may be formed by depositing one or more dielectric materials over the recessed metal gates 243 and optionally over recessed gate spacers 247 and performing a CMP process to the one or more dielectric materials.

Figure 27B:
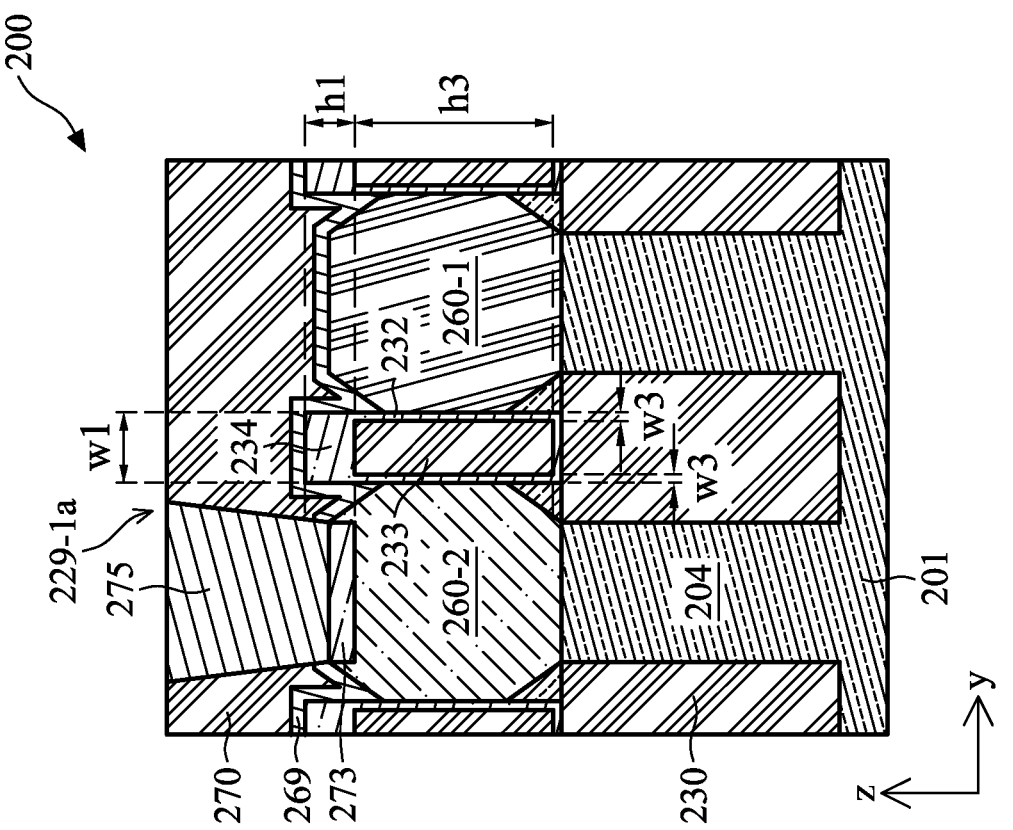
Figure 27A:
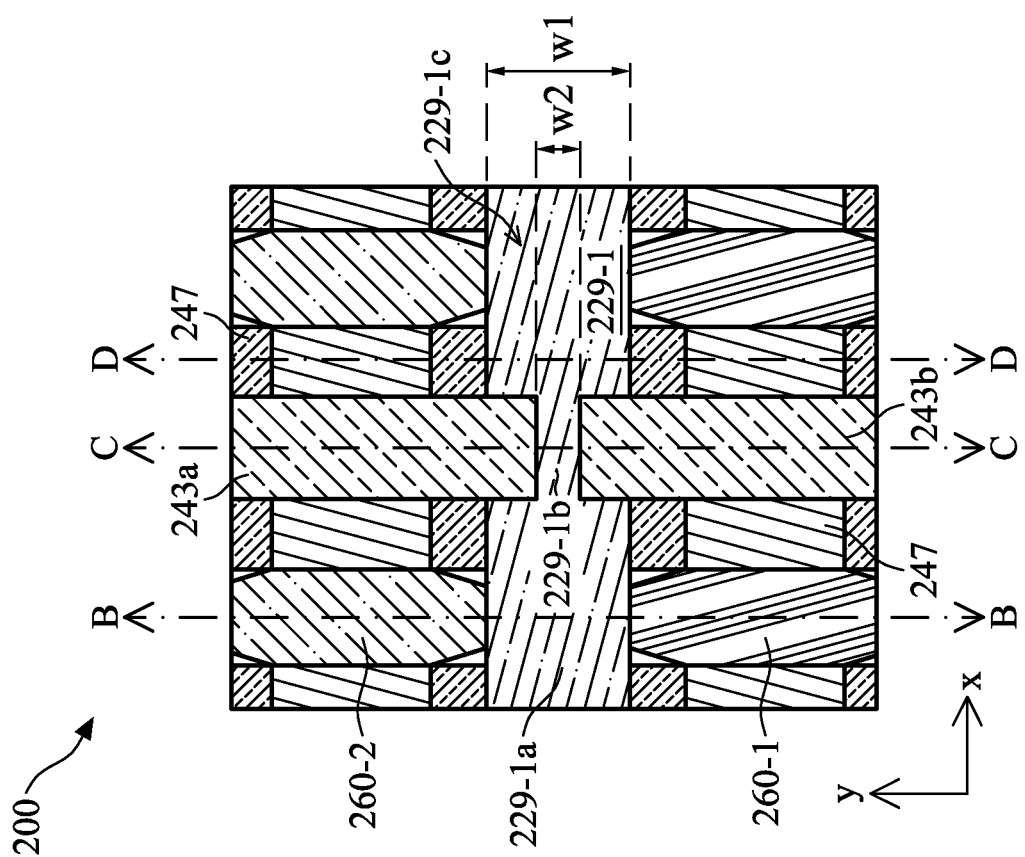
Figures 27C, 27D:
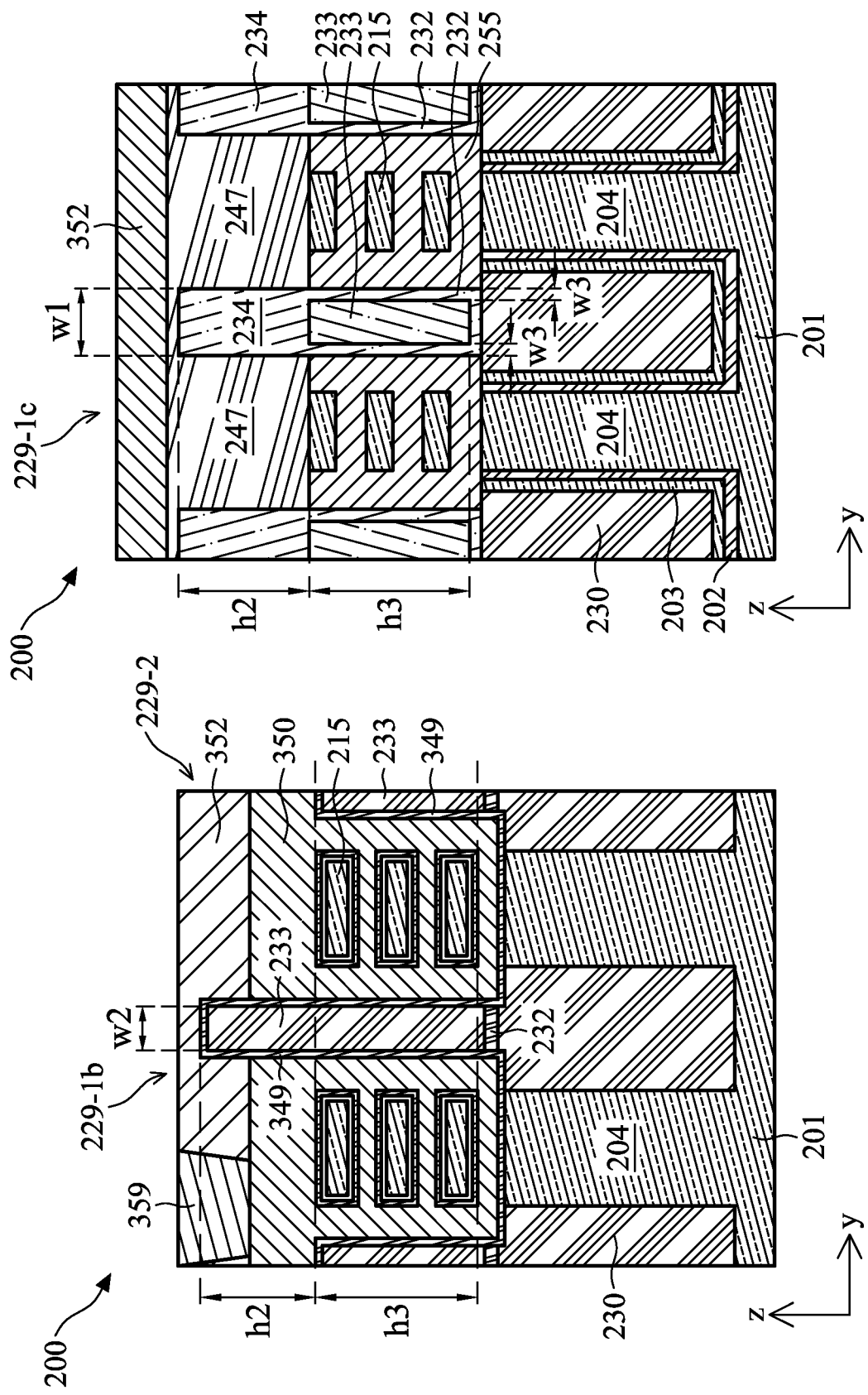

At operation 146, the method 100 (FIG. 1C) performs further fabrication, such as forming S/D contacts, forming S/D contact vias, forming gate vias, and forming interconnect layers. In that regard, FIG. 27A shows a top view of a portion of the device 200 after some further fabrication, and FIGS. 27B, 27C, and 27D illustrate cross-sectional views of the device 200, in portion, along the B-B line, the C-C line, and the D-D line in FIG. 27A, respectively. Particularly, the BB line cuts into the S/D region of the device 200 along the "y" direction, the C-C line cuts into the channel region (or gate region) of the device 200 along the "y" direction, and the D-D line cuts into the gate spacer region of the device 200 along the "y" direction.

Referring to FIG. 27B, the operation 146 forms silicide features 273 over the S/D features 260 (such as the S/D feature 260-2 illustrated in FIG. 27B) and forms S/D contacts (or vias) 275 over the silicide features 273. This may involve etching the ILD layer 270 and the CESL 269 to form S/D contact holes exposing the S/D features 260, forming the silicide features 273 on the exposed surfaces of the S/D features 260, and forming the S/D contacts (or vias) 275 over the silicide features 273. The silicide features 273 may be formed by depositing one or more metals into the S/D contact holes, performing an annealing process to the device 200 to cause reaction between the one or more metals and the S/D features 260 to produce the silicide features 273, and removing un-reacted portions of the one or more metals, leaving the silicide features 273 in the holes. The silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 275.

Referring to FIG. 27C, the operation 146 forms gate vias 359 electrically connecting to the gate electrode 350. In an embodiment, the gate vias 359 may each include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the gate vias 359.

Referring to FIG. 27A, from the top view, the dielectric fins 229-1 has three sections 229-1$a$, 229-1$b$, and 229-1$c$. The sections 229-1$a$ and 229-1$c$ have a width w1. The sections 229-1$b$ has a width w2. The width w2 is smaller than the width w1 due to the trimming process in the operation 138 discussed above. In some embodiments, the width w1 is in a range of about 10 nm to about 20 nm, and the width w2 is in a range of about 5 nm to about 15 nm. In various embodiments, the width w2 is about 0.35 to about 0.8 of the width w1. In some embodiments, the width w2 is smaller than the width w1 by about 2 nm to about 12 nm. The importance of these differences between w1 and w2 is discussed above with respect to the operation 138. Further, having the width w1 in the disclosed range (such as from about 10 nm to about 20 nm) helps to ensure that the dielectric fin sections 229-1$a$ and 229-1$c$ fully separate the S/D features 260-1 and 260-2 and prevent the S/D features 260-1 and 260-2 from accidentally merge with each other during epitaxial growth, yet still leaving enough room for forming large S/D features 260 for boosting circuit performance. If the dielectric fin sections 229-1$a$ and 229-1$c$ are too wide (such as greater than 20 nm), there might not be enough room to grow the S/D features 260, degrading the circuit performance. If the dielectric fin sections 229-1$a$ and 229-1$c$ are too narrow (such as less than 10 nm), the risk of accidentally merging the S/D features 260-1 and 260-2 increases and the coupling capacitance between the adjacent S/D features 260 also undesirably increases. In the present embodiment, the core of the dielectric fin 229-1 is the low-k dielectric layer 233, which helps to reduce such coupling capacitance. Having the width w2 in the disclosed range (such as from about 5 nm to about 15 nm) helps to ensure that the gate trenches are wide enough for forming high quality metal gates 243 (including the gate segments 243$a$ and 243$b$), yet the dielectric fin section 229-1$b$ is thick enough to isolate the metal gates 243$a$ and 243$b$. If the dielectric fin section 229-1$b$ is too wide (such as greater than 15 nm), the gate trenches become narrow and it might be difficult to fill the gate trenches with the metal gates 243 properly, causing transistor non-uniformity and/or long-term reliability issues. If the dielectric fin section 229-1$b$ is too narrow (such as less than 5 nm), the coupling capacitance between the adjacent metal gate segments 243$a$ and 243$b$ undesirably increases and the isolation between the adjacent metal gate segments 243$a$ and 243$b$ might be insufficient, leading to degradation of the device's TDDB performance. In some embodiments, the dielectric fins 229-2 also have similar three section configuration where it is narrower in the gate region and wider in the S/D regions and the gate spacer regions. Further, the widths of the three sections of the dielectric fins 229-2 may be similar to the widths of the three sections of the dielectric fins 229-1, respectively. In such embodiments, the section of the dielectric fins 229-2 inside the gate region may have a width in a range of about 5 nm to about 15 nm and the sections of the dielectric fins 229-2 inside the S/D region and the gate spacer region may have a width in a range of about 10 nm to about 20 nm. In some embodiments, the section of the dielectric fins 229-2 inside the gate region is fully removed by the operation 132.

Referring to FIG. 27B, the high-k dielectric helmet 234 has a thickness or height h1 in the S/D region (i.e., in the dielectric fin section 229-1$a$). Referring to FIGS. 27C and 27D, the high-k dielectric helmet 234 has a thickness or height h2 in the gate region (i.e., in the dielectric fin section 229-1$b$) and in the gate spacer region. In the present embodiment, the height h1 is smaller than the height h2 due to the S/D trench etching process of the operation 120 (see FIG. 13). In some embodiments, the height h2 is in a range of about 15 nm to about 35 nm, and the height h1 is up to 30 nm (i.e., from 0 nm to about 30 nm). Having the height h2 in the disclosed range helps to ensure the process margin in the self-aligned metal gate cutting process in the operation 142.

Referring to FIGS. 27B, 27C, and 27D, the low-k dielectric fill layer 233 has a thickness or height h3. In some embodiments, the height h3 is in a range of about 45 nm to about 65 nm to ensure the dielectric fins 229 have sufficient height to isolate the S/D features 260. The low-k dielectric layer 233 helps to reduce coupling capacitance between adjacent S/D features 260-1 and 260-2 and between the adjacent metal gates 243$a$ and 243$b$. As discussed earlier, the top surface of the low-k dielectric layer 233 may be even with the top surface of the topmost channel layer 215, higher than the top surface of the topmost channel layer 215 by up to 5 nm, or lower than the top surface of the topmost channel layer 215 by up to 5 nm in various embodiments.

Referring to FIGS. 27B and 27D, the dielectric fin sections 229-1$a$ and 229-1$c$ include the high-k dielectric liner 232 at the bottom of and on the sidewalls of the low-k dielectric fill layer 233. In some embodiments, the high-k dielectric liner 232 has a thickness w3 in a range of about 1 nm to about 6 nm. If the thickness w3 is too small (such as less than 1 nm), the high-k dielectric liner 232 may not withstand the various etching processes discussed above during the S/D trench etching and inner spacer formation. Consequently, the low-k dielectric fill layer 233 may be exposed, which might adversely affect the S/D features 260-1 and 260-2 (for example, elements of the low-k dielectric fill layer 233 might diffuse into the S/D features 260-1 and 260-2). If the thickness w3 is too large (such as more than 6 nm), the coupling capacitance between the S/D features 260-1 and 260-2 are unnecessarily increased, which might adversely slow down the circuit's operation. Referring to FIG. 27C, the high-k gate dielectric layer 349 is disposed on sidewalls of the low-k dielectric fill layer 233 in the dielectric fin section 229-1b.

Figures 27E, 28:
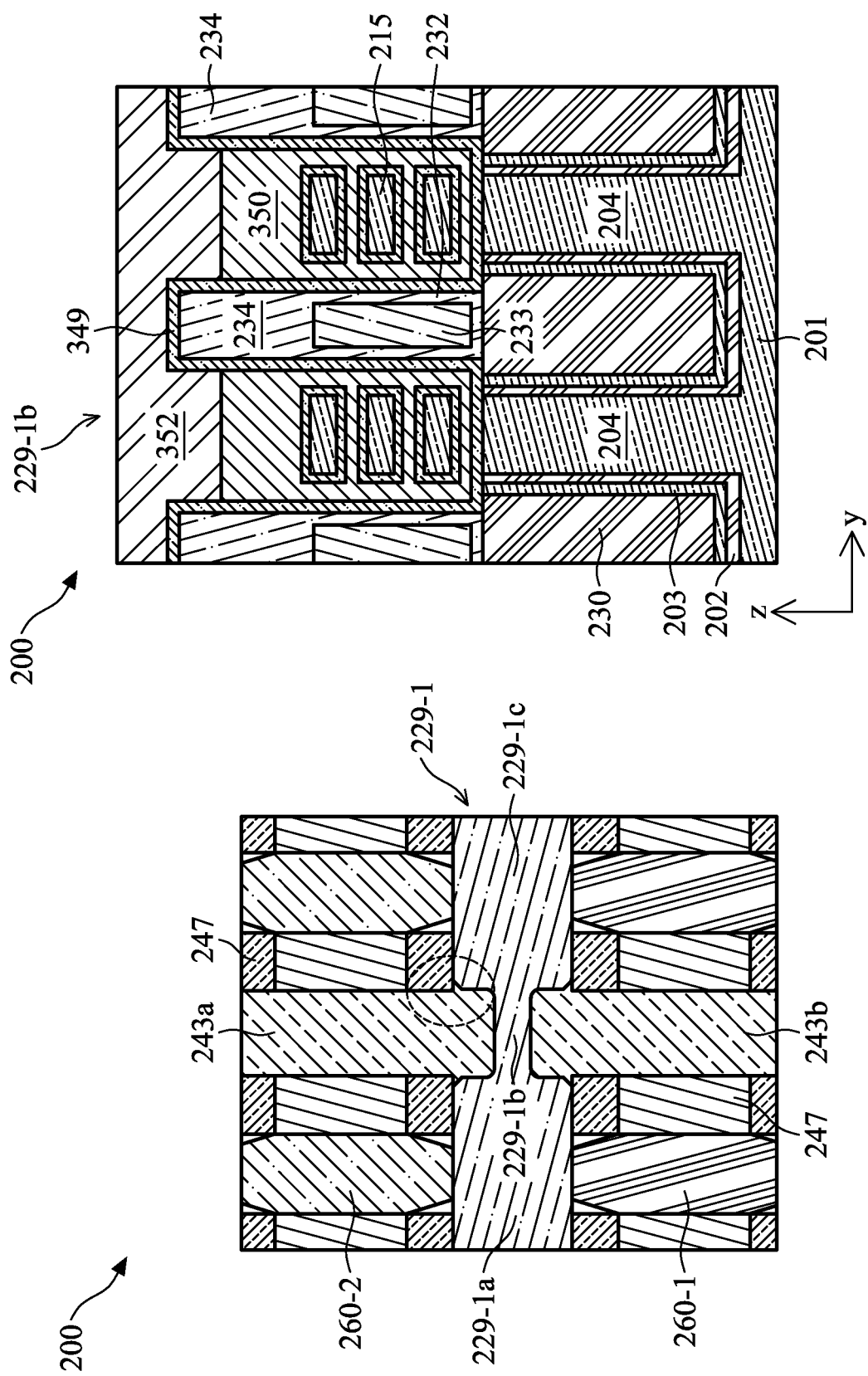

FIG. 27E shows a top view of a portion of the device 200 according to an alternative embodiment. In this embodiment, the corners of the dielectric fin sections 229-1a and 229-1c are rounded due to the trimming process of the operation 138.

FIG. 28 shows a cross-sectional view of a portion of the device 200 in the gate region, where the device 200 is fabricated according to another embodiment of the method 100. In this embodiment, the method 100 similarly performs the operation 102 through 146 as discussed above. However, the operation 138 (the trimming process) does not completely remove the high-k dielectric liner 232 from the sidewalls of the low-k dielectric fill layer 233. As a result, the dielectric fin section 229-1b includes the low-k dielectric fill layer 233 surrounded by the high-k dielectric liner 232 and the high-k dielectric helmet 234. Further, the high-k gate dielectric layer 349 is disposed over the high-k dielectric liner 232 and the high-k dielectric helmet 234.

Figure 30A:
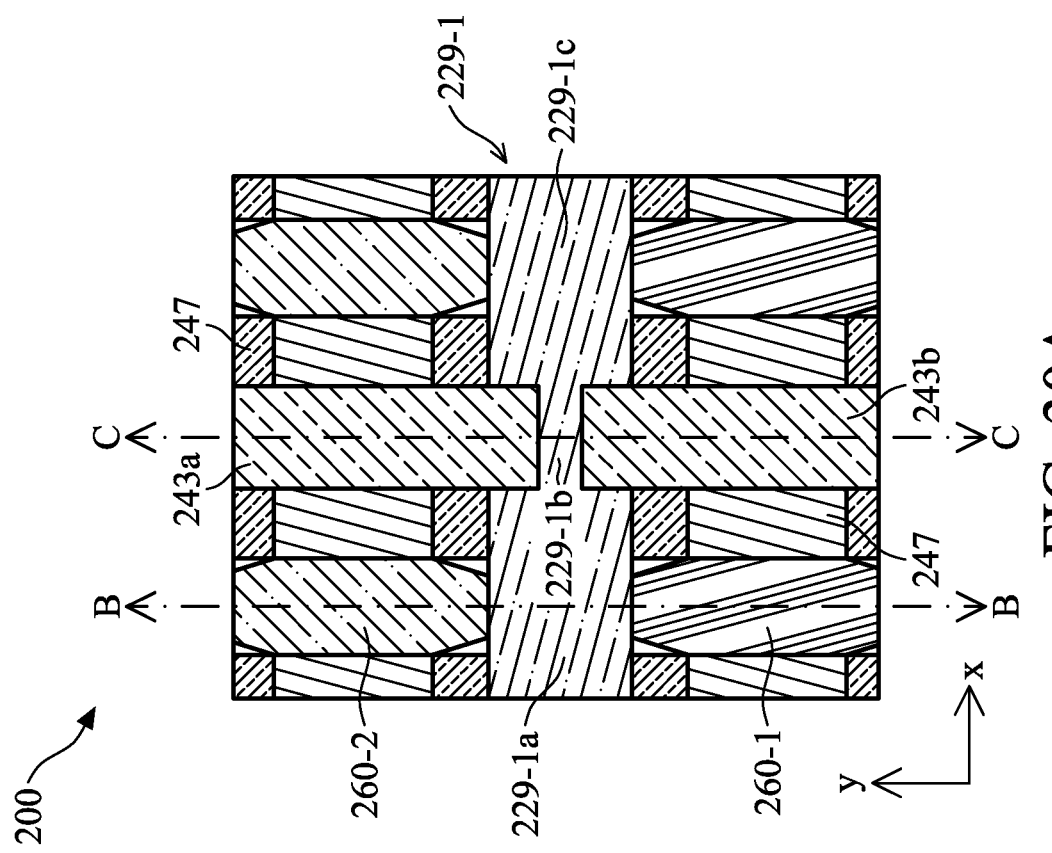
Figures 30B, 30C:
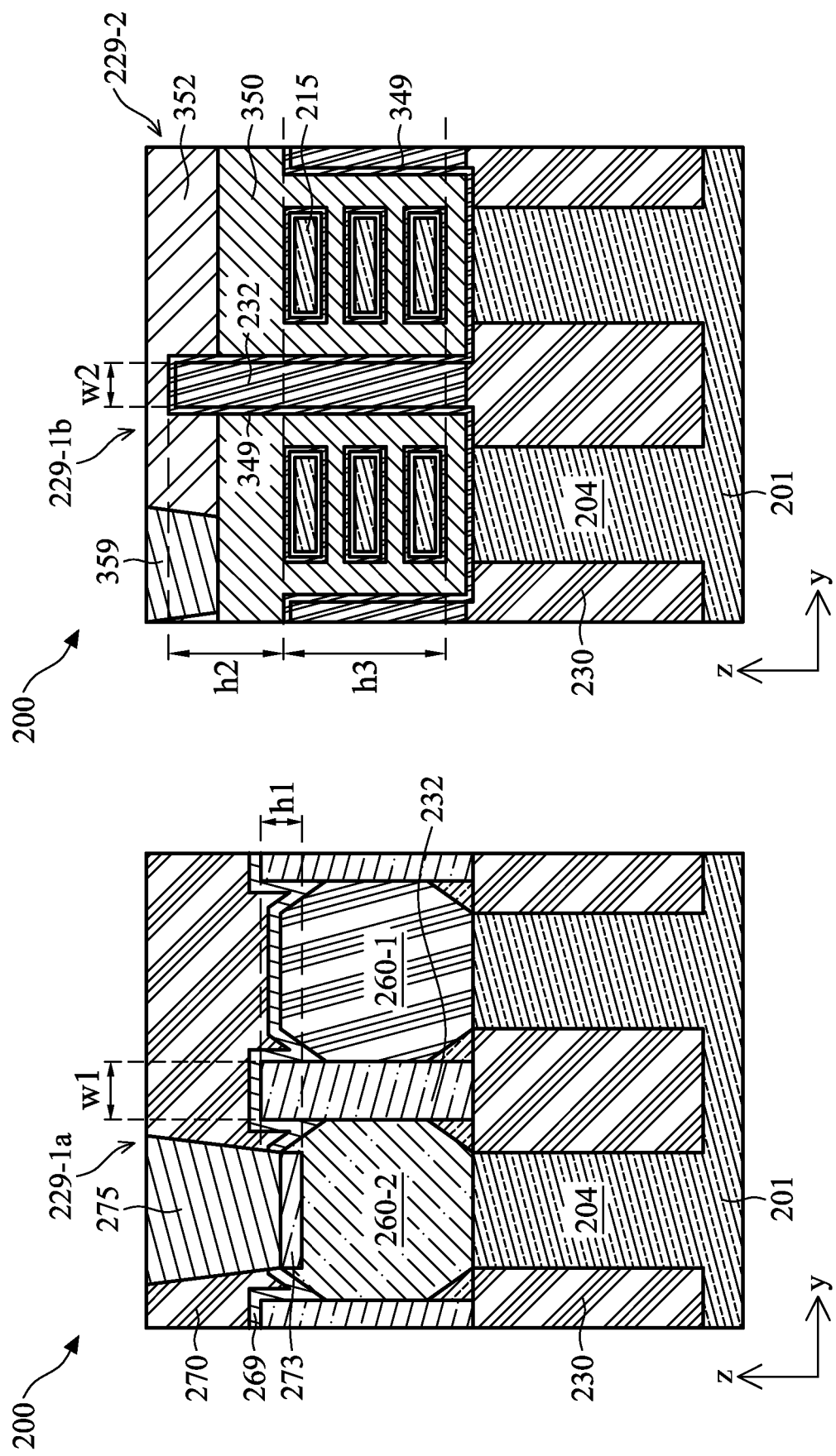
Figures 30D, 31:
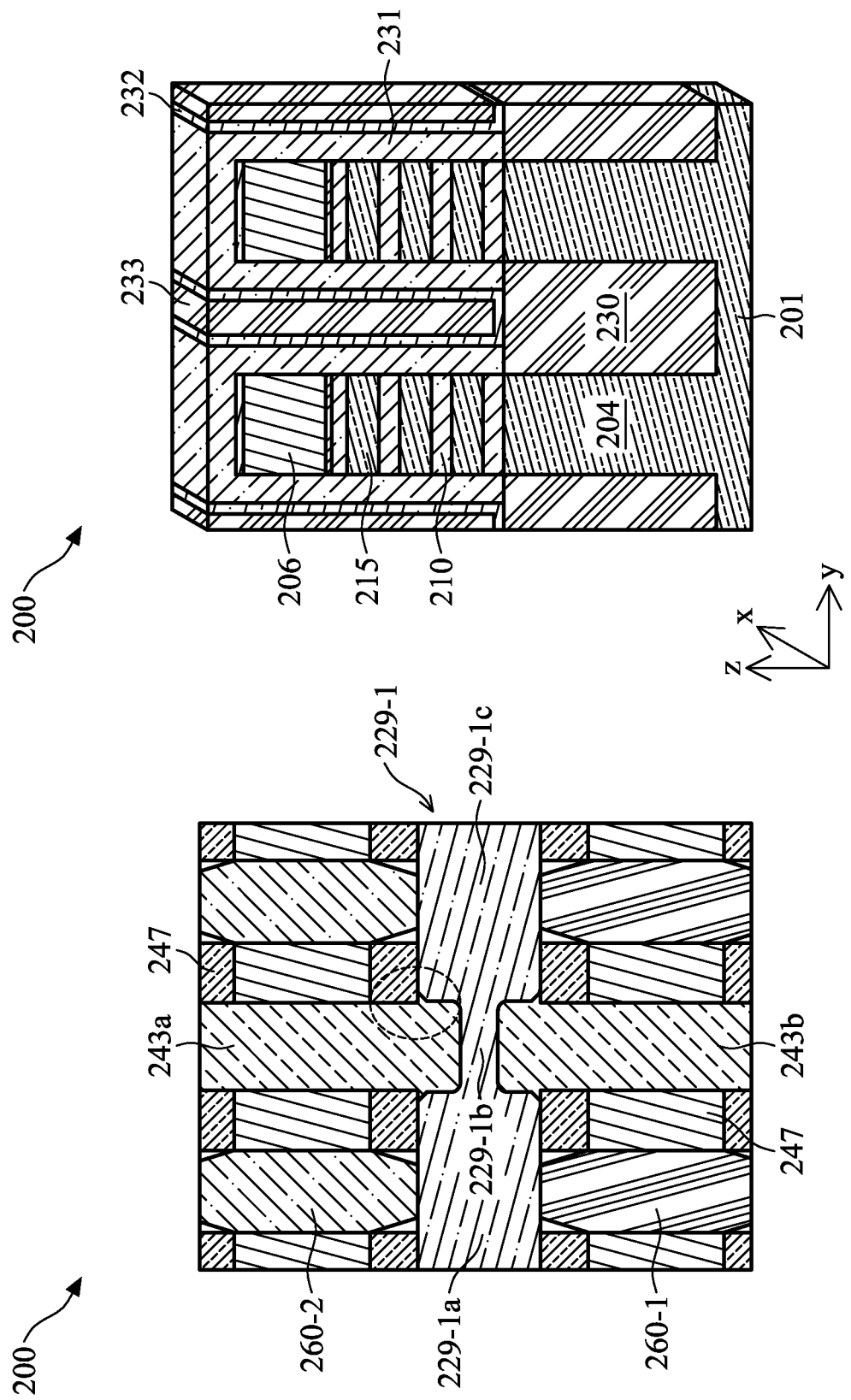

FIG. 29 illustrates a portion of the device 200 fabricated according to yet another embodiment of the method 100. In this embodiment, the method 100 similarly performs the operations 102 through 108. Then, during the operation 110, the high-k dielectric liner 232 fully fills the gap between adjacent cladding layer 231, such as shown in FIG. 29. Subsequently, the method 100 skips the operations 112, 114, and 116 and proceeds to the operation 118. FIG. 30A shows a top view of a portion of the device 200 after the method 100 has completed the operations 118 through 146, and FIGS. 30B and 30C illustrate cross-sectional views of the device 200, in portion, along the B-B line and the C-C line in FIG. 30A, respectively. Particularly, the B-B line cuts into the S/D region of the device 200 along the "y" direction, and the C-C line cuts into the channel region (or gate region) of the device 200 along the "y" direction. In this embodiment, the dielectric fins 229 are made up of the high-k dielectric liner 232 only. Other aspects of the device 200 in this embodiment (including the various dimensions w1, w2, and h1) are the same as those described above with reference to FIGS. 27A-D. Notably, the height of the dielectric fin 229-1b is same as the high-k dielectric liner layer 232 which is the sum of h2, h3, and w3 described with reference to FIGS. 27C and 27D. As illustrated in FIG. 30D, the dielectric fin sections 229-1a and 229-1c in this embodiment may also have rounded corners in some instances.

Figures 32A, 32B:
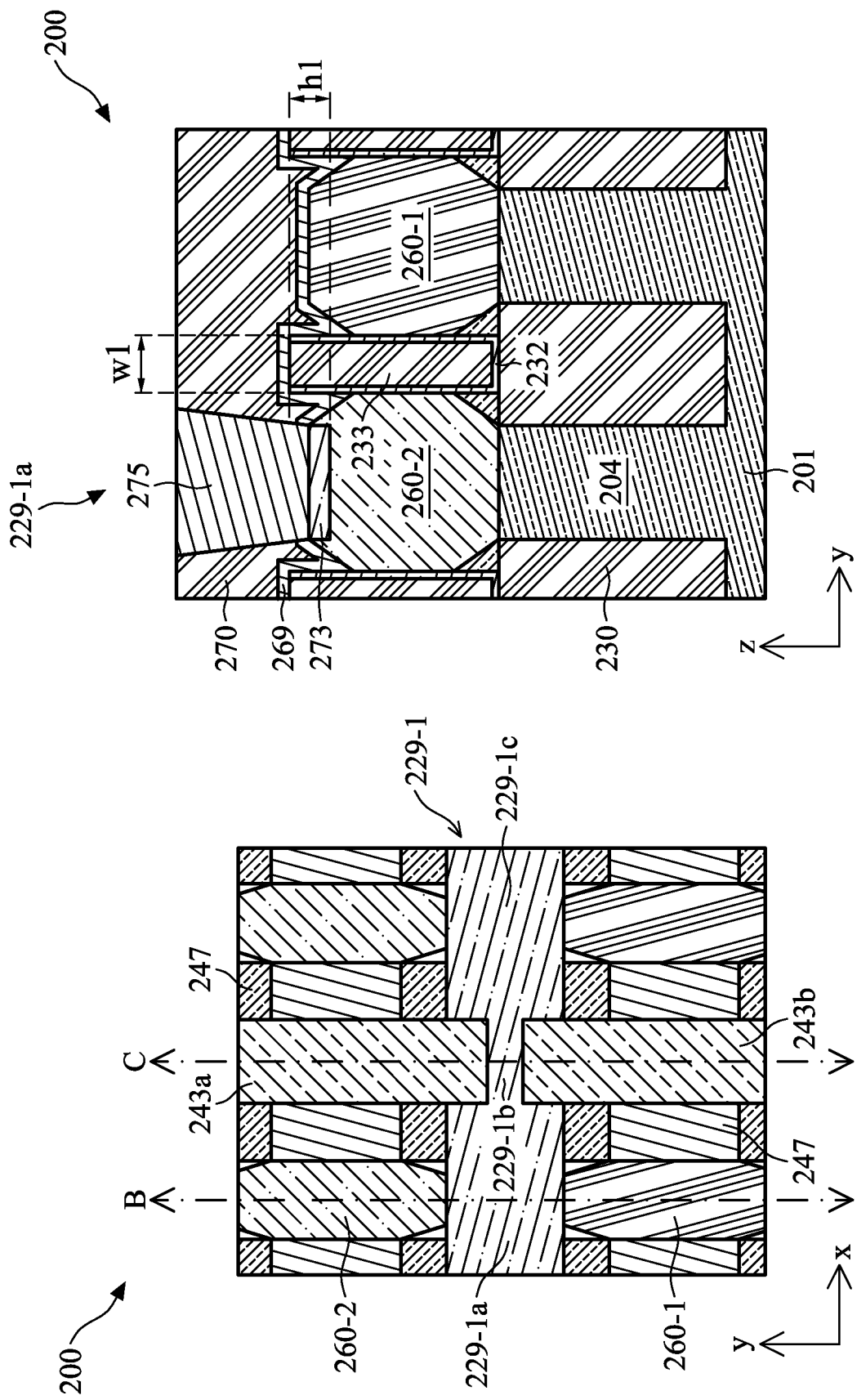
Figures 32C, 32D:
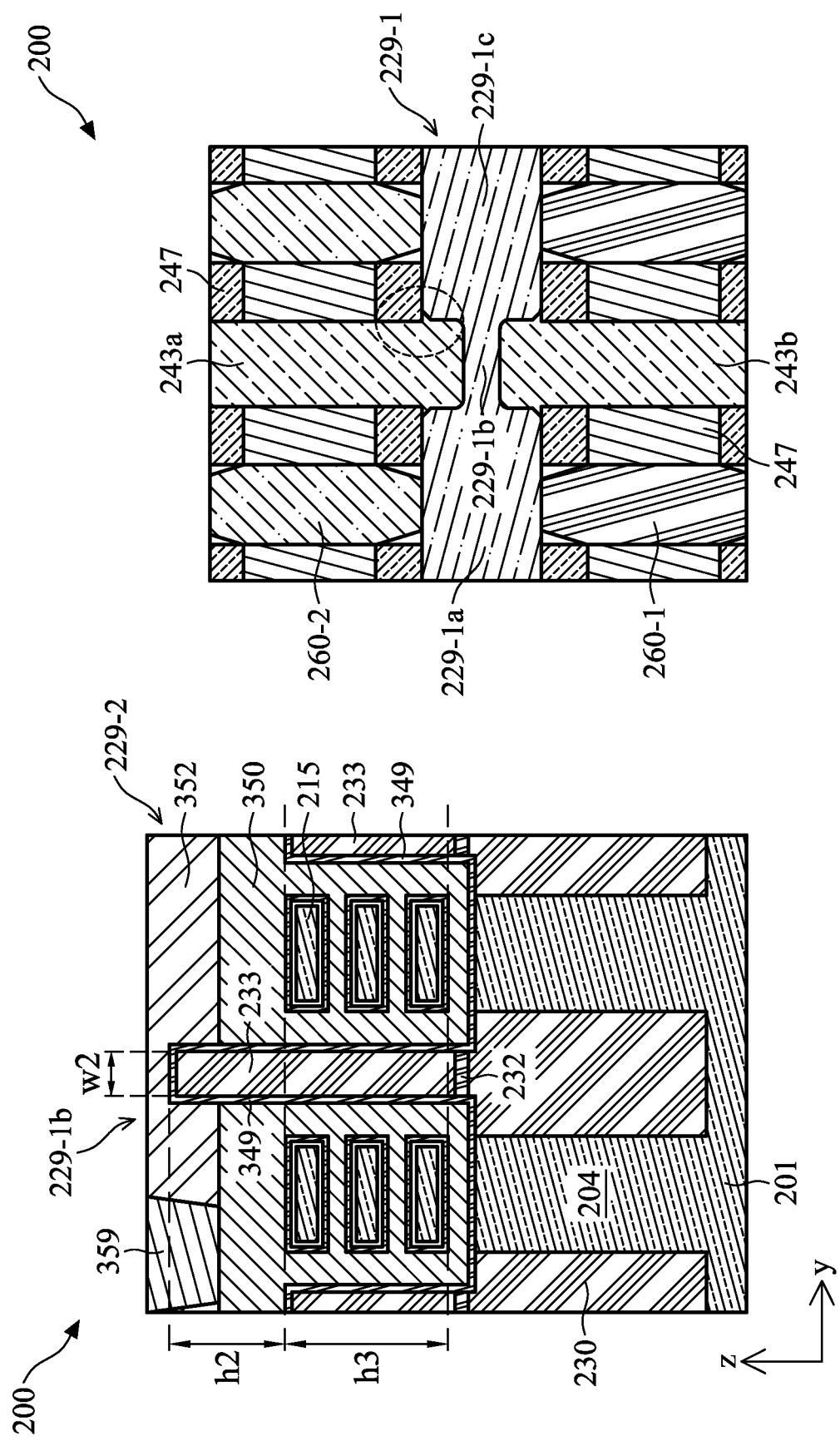

FIG. 31 illustrates a portion of the device 200 fabricated according to yet another embodiment of the method 100. In this embodiment, the method 100 similarly performs the operations 102 through 112. Then, the method 100 skips the operations 114 and proceeds to the operation 116. FIG. 32A shows a top view of a portion of the device 200 after the method 100 has completed the operations 116 through 146, and FIGS. 32B and 32C illustrate cross-sectional views of the device 200, in portion, along the B-B line and the C-C line in FIG. 32A, respectively. Particularly, the B-B line cuts into the S/D region of the device 200 along the "y" direction, and the C-C line cuts into the channel region (or gate region) of the device 200 along the "y" direction. In this embodiment, the dielectric fins 229 are made up of the high-k dielectric liner 232 and the low-k dielectric fill layer 233 and omits the high-k dielectric helmet 234. Other aspects of the device 200 in this embodiment (including the various dimensions w1, w2, and h1) are the same as those described above with reference to FIGS. 27A-D. Notably, the height of the low-k dielectric fill layer 233 is the sum of h2 and h3 described with reference to FIGS. 27C and 27D. As illustrated in FIG. 32D, the dielectric fin sections 229-1a and 229-1c in this embodiment may also have rounded corners in some instances.

Although not intended to be limiting, embodiments of the present disclosure provide one or more of the following advantages. For example, embodiments of the present disclosure form dielectric fins to separate S/D features and to separate metal gates. The dielectric fins are trimmed to be narrower between the metal gates than between the S/D features. This provides more room for metal gate formation so that the metal gates can be formed more uniformly and with higher quality. At the same time, the dielectric fins provide good isolation between adjacent S/D features to avoid accidental merging of the S/D features. Embodiments of the present disclosure can be readily integrated into existing semiconductor manufacturing processes.

In one example aspect, the present disclosure is directed to a method that includes providing a structure having two fins extending from a substrate; an isolation structure isolating bottom portions of the fins; source/drain (S/D) features over each of the fins; a dielectric fin oriented lengthwise parallel to the fins and disposed between the two fins and over the isolation structure; a dummy gate stack over the isolation structure, the fins, and the dielectric fin; and one or more dielectric layers over sidewalls of the dummy gate stack. The method further includes removing the dummy gate stack to result in a gate trench within the one or more dielectric layers, wherein the dielectric fin is exposed in the gate trench; trimming the dielectric fin to reduce a width of the dielectric fin; and after the trimming, forming a high-k metal gate in the gate trench.

In an embodiment, the method further includes etching back the high-k metal gate to a level below a top surface of the dielectric fin, thereby separating the high-k metal gate into two segments disposed on two sides of the dielectric fin; and depositing a dielectric cap over the two segments of the high-k metal gate and the dielectric fin. In a further embodiment, the dielectric fin includes a low-k dielectric layer and a high-k dielectric layer over the low-k dielectric layer, wherein a top surface of the two segments of the high-k metal gate is above a top surface of the low-k dielectric layer and below a top surface of the high-k dielectric layer.

In some embodiment of the method, the dielectric fin includes a low-k dielectric layer and a high-k dielectric layer disposed on sidewalls of the low-k dielectric layer, wherein the trimming of the dielectric fin includes completely removing the high-k dielectric layer from the sidewalls of the low-k dielectric layer. In a further embodiment, the trimming of the dielectric fin further includes etching the low-k dielectric layer after the completely removing of the high-k dielectric layer from the sidewalls of the low-k dielectric layer.

In an embodiment of the method, the trimming of the dielectric fin reduces a width of the dielectric fin by about 2 nm to about 12 nm. In another embodiment of the method, the dielectric fin includes a low-k dielectric layer and a high-k dielectric layer disposed on sidewalls of the low-k dielectric layer, wherein the trimming of the dielectric fin includes partially removing the high-k dielectric layer from the sidewalls of the low-k dielectric layer and keeping at least a portion of the high-k dielectric layer disposed on the sidewalls of the low-k dielectric layer.

In an embodiment of the method, the dielectric fin includes one or more high-k dielectric layers that extend a full width of the dielectric fin. In an embodiment wherein the dielectric fin is a first dielectric fin and the structure further includes a second dielectric fin adjacent one of the fins, before the removing of the dummy gate stack, the method further includes partially recessing the dummy gate stack to a level below a top surface of the first and the second dielectric fins; forming an etch mask covering the first dielectric fin and exposing the second dielectric fin; recessing the second dielectric fin; and removing the etch mask.

In another example aspect, the present disclosure is directed to a method that includes providing a structure having fins extending from a substrate; an isolation structure isolating bottom portions of the fins; source/drain (S/D) features over the fins; dielectric fins oriented lengthwise parallel to the fins, disposed between the adjacent fins and over the isolation structure, and isolating the S/D features; a dummy gate stack over the isolation structure, the fins, and the dielectric fins; and one or more dielectric layers over sidewalls of the dummy gate stack. The method further includes partially recessing the dummy gate stack, thereby exposing portions of the dielectric fins; forming an etch mask covering a first dielectric fin of the dielectric fins and exposing a second dielectric fin of the dielectric fins; partially etching the second dielectric fin through the etch mask, such that a top surface of the second dielectric fin is below a top surface of the first dielectric fin; removing the etch mask; removing the dummy gate stack to result in a gate trench within the one or more dielectric layers, wherein at least the first dielectric fin is exposed in the gate trench; trimming the first dielectric fin to reduce a width of the first dielectric fin; and after the trimming, forming a high-k metal gate in the gate trench.

In an embodiment, the method further includes etching back the high-k metal gate to a level below the top surface of the first dielectric fin and above the top surface of the second dielectric fin, thereby separating the high-k metal gate into two segments disposed on two sides of the first dielectric fin; and depositing a dielectric cap over the two segments of the high-k metal gate and the first dielectric fin.

In an embodiment of the method, each of the first and the second dielectric fins includes a low-k dielectric layer and a high-k dielectric layer over the low-k dielectric layer, wherein the partially etching of the second dielectric fin completely removes the high-k dielectric layer of the second dielectric fin. In another embodiment, each of the first and the second dielectric fins includes a low-k dielectric layer and a high-k dielectric layer over the low-k dielectric layer, wherein the partially etching of the second dielectric fin partially removes the high-k dielectric layer of the second dielectric fin.

In an embodiment of the method, the trimming of the first dielectric fin also reduces a width of the second dielectric fin. In another embodiment, the first dielectric fin includes a low-k dielectric layer and a high-k dielectric layer disposed on sidewalls of the low-k dielectric layer, wherein the trimming of the first dielectric fin includes completely removing the high-k dielectric layer from the sidewalls of the low-k dielectric layer. In yet another embodiment, the first dielectric fin includes a low-k dielectric layer and a high-k dielectric layer disposed on sidewalls of the low-k dielectric layer, wherein the trimming of the first dielectric fin includes partially removing the high-k dielectric layer from the sidewalls of the low-k dielectric layer and keeping at least a portion of the high-k dielectric layer disposed on the sidewalls of the low-k dielectric layer.

In yet another example aspect, the present disclosure is directed to a semiconductor structure that includes a substrate; an isolation structure over the substrate; two source/drain (S/D) features over the isolation structure; one or more channel semiconductor layers laterally connecting the two S/D features; a high-k metal gate between the two S/D features and engaging the one or more channel semiconductor layers; and a dielectric fin over the isolation structure and adjacent to the two S/D features and the high-k metal gate. A top surface of the dielectric fin is above a top surface of the high-k metal gate. A first portion of the dielectric fin adjacent to the high-k metal gate is narrower than a second portion of the dielectric fin adjacent to the two S/D features.

In an embodiment of the semiconductor structure, the first portion of the dielectric fin is narrower than the second portion of the dielectric fin by about 2 nm to about 12 nm. In another embodiment, each of the first and the second portions of the dielectric fin includes a low-k dielectric layer and a high-k dielectric layer disposed on sidewalls of the low-k dielectric layer. In a further embodiment, the low-k dielectric layer of the first portion is narrower than the low-k dielectric layer of the second portion.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having two fins extending from a substrate; an isolation structure isolating bottom portions of the fins; source/drain (S/D) features over each of the fins; a dielectric fin oriented lengthwise parallel to the fins and disposed between the two fins and over the isolation structure; a dummy gate stack over the isolation structure, the fins, and the dielectric fin; and one or more dielectric layers over sidewalls of the dummy gate stack, wherein the dielectric fin comprises a portion disposed directly under the dummy gate stack;
removing the dummy gate stack to result in a gate trench within the one or more dielectric layers, wherein the portion of the dielectric fin is exposed in the gate trench;
after the removing of the dummy gate stack, trimming the portion of the dielectric fin to reduce a width of the portion of the dielectric fin;
after the trimming, forming a high-k metal gate in the gate trench.

2. The method of claim 1, further comprising:
etching back the high-k metal gate to a level below a top surface of the dielectric fin, thereby separating the high-k metal gate into two segments disposed on two sides of the dielectric fin; and
depositing a dielectric cap over the two segments of the high-k metal gate and the dielectric fin.

3. The method of claim 2, wherein the dielectric fin includes a low-k dielectric layer and a high-k dielectric layer over the low-k dielectric layer, wherein a top surface of the two segments of the high-k metal gate is above a top surface of the low-k dielectric layer and below a top surface of the high-k dielectric layer.

4. The method of claim 1, wherein the dielectric fin includes a low-k dielectric layer and a high-k dielectric layer disposed on sidewalls of the low-k dielectric layer, wherein the trimming of the dielectric fin includes completely removing the high-k dielectric layer from the sidewalls of the low-k dielectric layer.

5. The method of claim 4, wherein the trimming of the dielectric fin further includes etching the low-k dielectric layer after the completely removing of the high-k dielectric layer from the sidewalls of the low-k dielectric layer.

6. The method of claim 1, wherein the trimming of the portion of the dielectric fin reduces a width of the portion of the dielectric fin by about 2 nm to about 12 nm.

7. The method of claim 1, wherein the dielectric fin includes a low-k dielectric layer and a high-k dielectric layer disposed on sidewalls of the low-k dielectric layer, wherein the trimming of the dielectric fin includes partially removing the high-k dielectric layer from the sidewalls of the low-k dielectric layer and keeping at least a portion of the high-k dielectric layer disposed on the sidewalls of the low-k dielectric layer.

8. The method of claim 1, wherein the dielectric fin includes one or more high-k dielectric layers that extend a full width of the dielectric fin.

9. The method of claim 1, wherein the dielectric fin is a first dielectric fin and the structure further includes a second dielectric fin adjacent one of the fins, before the removing of the dummy gate stack, further comprising:
partially recessing the dummy gate stack to a level below a top surface of the first and the second dielectric fins;
forming an etch mask covering the first dielectric fin and exposing the second dielectric fin;
recessing the second dielectric fin; and
removing the etch mask.

10. A method, comprising:
providing a structure having fins extending from a substrate; an isolation structure isolating bottom portions of the fins; source/drain (S/D) features over the fins; dielectric fins oriented lengthwise parallel to the fins, disposed between two adjacent fins of the fins and over the isolation structure, and isolating the S/D features; a dummy gate stack over the isolation structure, the fins, and the dielectric fins; and one or more dielectric layers over sidewalls of the dummy gate stack;
partially recessing the dummy gate stack, thereby exposing portions of the dielectric fins;
forming an etch mask covering a first dielectric fin of the dielectric fins and exposing a second dielectric fin of the dielectric fins;
partially etching the second dielectric fin through the etch mask, such that a top surface of the second dielectric fin is below a top surface of the first dielectric fin;
removing the etch mask;
removing the dummy gate stack to result in a gate trench within the one or more dielectric layers, wherein at least the first dielectric fin is exposed in the gate trench;
trimming the first dielectric fin to reduce a width of the first dielectric fin; and
after the trimming, forming a high-k metal gate in the gate trench.

11. The method of claim 10, further comprising:
etching back the high-k metal gate to a level below the top surface of the first dielectric fin and above the top surface of the second dielectric fin, thereby separating the high-k metal gate into two segments disposed on two sides of the first dielectric fin; and
depositing a dielectric cap over the two segments of the high-k metal gate and the first dielectric fin.

12. The method of claim 10, wherein each of the first and the second dielectric fins includes a low-k dielectric layer and a high-k dielectric layer over the low-k dielectric layer, wherein the partially etching of the second dielectric fin completely removes the high-k dielectric layer of the second dielectric fin.

13. The method of claim 10, wherein each of the first and the second dielectric fins includes a low-k dielectric layer and a high-k dielectric layer over the low-k dielectric layer, wherein the partially etching of the second dielectric fin partially removes the high-k dielectric layer of the second dielectric fin.

14. The method of claim 10, wherein the trimming of the first dielectric fin also reduces a width of the second dielectric fin.

15. The method of claim 10, wherein the first dielectric fin includes a low-k dielectric layer and a high-k dielectric layer disposed on sidewalls of the low-k dielectric layer, wherein the trimming of the first dielectric fin includes completely removing the high-k dielectric layer from the sidewalls of the low-k dielectric layer.

16. The method of claim 10, wherein the first dielectric fin includes a low-k dielectric layer and a high-k dielectric layer disposed on sidewalls of the low-k dielectric layer, wherein the trimming of the first dielectric fin includes partially removing the high-k dielectric layer from the sidewalls of the low-k dielectric layer and keeping at least a portion of the high-k dielectric layer disposed on the sidewalls of the low-k dielectric layer.

17. A method, comprising:
providing a structure having two semiconductor fins extending from a substrate; an isolation structure isolating bottom portions of the semiconductor fins from each other; a dielectric fin oriented lengthwise parallel to the semiconductor fins and disposed between the two semiconductor fins and over the isolation structure; a dummy gate stack over the isolation structure, the semiconductor fins, and the dielectric fin; and one or more dielectric layers over sidewalls of the dummy gate stack;
etching the dummy gate stack to result in a gate trench within the one or more dielectric layers, wherein the dielectric fin is exposed in the gate trench;
trimming a width of the dielectric fin;
after the trimming, forming a high-k metal gate in the gate trench; and
etching back the high-k metal gate to a level below a top surface of the dielectric fin, thereby separating the high-k metal gate into two segments disposed on two sides of the dielectric fin.

18. The method of claim 17, wherein the dielectric fin includes a low-k dielectric layer and a high-k dielectric layer over the low-k dielectric layer, wherein a top surface of the two segments of the high-k metal gate is above a top surface of the low-k dielectric layer and below a top surface of the high-k dielectric layer.

19. The method of claim 17, wherein the dielectric fin includes a low-k dielectric layer and a high-k dielectric layer disposed on sidewalls of the low-k dielectric layer, wherein the trimming includes partially removing the high-k dielectric layer from the sidewalls of the low-k dielectric layer.

20. The method of claim 17, wherein the dielectric fin includes a low-k dielectric layer and a high-k dielectric layer disposed on sidewalls of the low-k dielectric layer, wherein the trimming includes etching both the high-k dielectric layer and the low-k dielectric layer.

* * * * *